United States Patent
Boni et al.

(10) Patent No.: US 11,953,813 B2
(45) Date of Patent: Apr. 9, 2024

(54) MICROELECTROMECHANICAL DEVICE WITH A STRUCTURE TILTABLE BY PIEZOELECTRIC ACTUATION HAVING IMPROVED MECHANICAL AND ELECTRICAL CHARACTERISTICS

(71) Applicant: STMicroelectronics S.r.l., Agrate Brianza (IT)

(72) Inventors: Nicolo' Boni, Mountain View, CA (US); Roberto Carminati, Piancogno (IT); Massimiliano Merli, Stradella (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/134,671

(22) Filed: Apr. 14, 2023

(65) Prior Publication Data

US 2023/0251556 A1    Aug. 10, 2023

Related U.S. Application Data

(63) Continuation of application No. 16/704,484, filed on Dec. 5, 2019, now Pat. No. 11,656,539.

(30) Foreign Application Priority Data

Dec. 14, 2018   (IT) .......................... 102018000011112
Mar. 28, 2019   (EP) ..................................... 19165958

(51) Int. Cl.
*G02B 26/08*   (2006.01)
*B81B 3/00*    (2006.01)
(Continued)

(52) U.S. Cl.
CPC .......... *G03B 21/008* (2013.01); *B81B 3/0021* (2013.01); *G02B 26/0858* (2013.01);
(Continued)

(58) Field of Classification Search
CPC .... G03B 21/008; G03B 21/28; B81B 3/0021; B81B 2201/032; B81B 2201/042;
(Continued)

(56) References Cited

U.S. PATENT DOCUMENTS 9,105,834 B2   8/2015   Davis et al.
9,729,038 B2   8/2017   Takimoto et al.
(Continued)

FOREIGN PATENT DOCUMENTS

| | | |
|---|---|---|
| CN | 108761773 A | 11/2018 |
| EP | 3178783 B1 | 1/2019 |
| WO | 2010113602 A1 | 10/2010 |

OTHER PUBLICATIONS

IT Search Report and Written Opinion for priority application, IT Appl No. 102018000011112 dated Aug. 15, 2019 (7 pages).
(Continued)

*Primary Examiner* — Euncha P Cherry
(74) *Attorney, Agent, or Firm* — Crowe & Dunlevy

(57) ABSTRACT

Disclosed herein is a microelectromechanical device that features a fixed structure defining a cavity, a tiltable structure elastically suspended within the cavity, and a piezoelectrically driven actuation structure that rotates the tiltable structure about a first rotation axis. The actuation structure includes driving arms with piezoelectric material, elastically coupled to the tiltable structure by decoupling elastic elements that are stiff to out-of-plane movements but compliant to torsional movements. The tiltable structure is elastically coupled to the fixed structure at the first rotation axis using elastic suspension elements, while the fixed structure forms a frame surrounding the cavity with supporting elements. A lever mechanism is coupled between a supporting element and a driving arm.

21 Claims, 11 Drawing Sheets

(51) Int. Cl.
  *G02B 26/10* (2006.01)
  *G03B 21/00* (2006.01)
  *G03B 21/28* (2006.01)
(52) U.S. Cl.
  CPC ........... *G02B 26/105* (2013.01); *G03B 21/28* (2013.01); *B81B 2201/032* (2013.01); *B81B 2201/042* (2013.01); *B81B 2203/0118* (2013.01); *B81B 2203/0315* (2013.01); *B81B 2203/04* (2013.01); *B81B 2203/058* (2013.01)
(58) Field of Classification Search
  CPC ..... B81B 2203/0118; B81B 2203/0315; B81B 2203/04; B81B 2203/058; B81B 2203/0163; B81B 3/0048; B81B 5/00; B81B 7/02; B81B 2201/02; B81B 2201/04; G02B 26/0858; G02B 26/105
  See application file for complete search history.

(56) References Cited

U.S. PATENT DOCUMENTS

| 11,656,539 | B2* | 5/2023 | Boni | G02B 26/105 |
| | | | | 359/214.1 |
| 2007/0058238 | A1 | 3/2007 | Mala et al. | |
| 2010/0328745 | A1 | 12/2010 | Kouyama | |
| 2011/0292479 | A1 | 12/2011 | Hiraoka et al. | |
| 2018/0095356 | A1 | 4/2018 | Kimura et al. | |
| 2018/0180871 | A1 | 6/2018 | Costantini et al. | |

OTHER PUBLICATIONS

EPO Search Report and Written Opinion for counterpart EP Appl. No. 19165958.0 dated Sep. 11, 2019 (6 pages).

First Office Action for counterpart EP Appl. No. 19165958.0, report dated Jul. 8, 2022, 5 pgs.

* cited by examiner

MICROELECTROMECHANICAL DEVICE WITH A STRUCTURE TILTABLE BY PIEZOELECTRIC ACTUATION HAVING IMPROVED MECHANICAL AND ELECTRICAL CHARACTERISTICS

RELATED APPLICATION

This application is a continuation of U.S. patent application Ser. No. 16/704,484, filed Dec. 5, 2019, which claims the priority benefit of Italian Application for Patent No. 102018000011112, filed on Dec. 14, 2018, and claims the priority benefit of European Application for Patent No. 19165958.0, filed on Mar. 28, 2019, the contents of which are hereby incorporated by reference in their entireties to the maximum extent allowable by law.

TECHNICAL FIELD

This disclosure relates to a microelectromechanical device, made with MEMS (Micro-Electro-Mechanical System) technology, with a structure tiltable by piezoelectric actuation, having improved mechanical and electrical characteristics.

In particular, hereinafter reference will be made, without this implying any loss of generality, to a microelectromechanical mirror device, in which the tiltable structure carries a suitable reflecting surface.

BACKGROUND

In a known manner, microelectromechanical mirror devices are used in portable apparatuses, such as smartphones, tablets, notebooks, and PDAs, for optical applications, in particular in order to direct, with desired patterns, beams of light radiation generated by a light source, for projecting images at a distance. Thanks to the reduced size, these devices allow to meet stringent requisites as regards occupation of space, in terms of area and thickness.

For instance, microelectromechanical mirror devices are used in miniaturized projector apparatuses (the so-called pico-projectors), which are able to project images at a distance and generate desired light patterns.

Microelectromechanical mirror devices generally include a mirror structure elastically supported above a cavity and obtained starting from a body of semiconductor material so as to be movable, for example with a tilting or rotation movement out of a corresponding plane of main extension, in order to direct the incident light beam in a desired manner.

Typically, a deviation of the light beam along two axes is required, which can be obtained by two microelectromechanical mirror devices of a uniaxial type, or else by a single microelectromechanical mirror device of a biaxial type.

FIG. 1A is a schematic illustration of a pico-projector 1 comprising a light source 2, typically a laser source, which generates a light beam that is deflected by a mirror arrangement 3 towards a screen 4.

In the example illustrated schematically in the aforesaid FIG. 1A, the mirror arrangement 3 comprises: a first mirror device 3a, of a uniaxial type, driven so as to rotate about a first axis (defined as "vertical axis A") with a resonant movement, to generate a fast horizontal scan; and a second mirror device 3b, which is also of a uniaxial type, driven so as to rotate about a second axis (defined as "horizontal axis B") with a linear or quasi-static movement (i.e., at a frequency much lower than the frequency of the resonant movement), for generating a slow vertical scan, for example with a sawtooth profile.

The first and the second mirror devices 3a, 3b co-operate for generating a scanning pattern on the screen 4, which is illustrated schematically and designated by 5 in FIG. 1A. In particular, the first mirror device 3a, rotating about the vertical axis A, "draws" a horizontal line on the second mirror device 3b; and the second mirror device 3b, rotating about the horizontal axis B, directs the projected image onto a desired rectangular surface on the screen 4.

Alternatively, as illustrated schematically in FIG. 1B, the mirror arrangement 3 of the pico-projector 1 may comprise a single mirror device, designated by 3c, of a two-dimensional type, i.e., controlled so as to rotate both about the vertical axis A with a resonant movement, and about the horizontal axis B with a linear movement.

In any case, rotation of the mirror device is driven via an actuation system that may be of an electrostatic, electromagnetic, or piezoelectric type.

Electrostatic actuation systems in general require high operating voltages, whereas electromagnetic actuation systems in general entail a high-power consumption.

It has hence been proposed to control the scanning movement, in particular at least the quasi-static linear movement about the horizontal axis B, in a piezoelectric way.

For instance, in the mirror device described in United States Patent Application Publication No. 2011/0292479, incorporated by reference, a suspended frame is connected to a fixed structure via spring elements having a serpentine shape constituted by a plurality of mutually parallel arms arranged alongside one another. Each arm carries a piezoelectric band, and adjacent piezoelectric bands are biased with voltages of opposite polarity. Given the characteristics of piezoelectric materials, this biasing causes deformation in the opposite direction (upwards and downwards) of adjacent arms and consequent rotation of the suspended frame in a first direction about the horizontal axis B. By applying an opposite biasing, rotation of the frame is obtained in a second direction, opposite to the first. The vertical scan can hence be obtained by applying alternating bipolar voltages to the arms.

An actuation system of a similar type may drive rotation about the vertical axis A, so as to also control the horizontal scan.

Another mirror device with piezoelectric actuation is described in European Patent No. 3178783 A1, incorporated by reference. This mirror device has: a tiltable structure, which rotates about the horizontal axis B; a fixed structure; and an actuation structure of a piezoelectric type, coupled between the tiltable structure and the fixed structure. The actuation structure is formed by spring elements having a spiral shape. The spring elements are each formed by a plurality of driving arms, which extend in a direction transverse to the horizontal axis B, each driving arm bearing a respective piezoelectric band made of piezoelectric material. The driving arms are divided into two sets driven in phase opposition to obtain rotation of the tiltable structure in opposite directions about the horizontal axis B.

FIGS. 2A-2B are schematic illustrations of a portion of a mirror device, designated by 10, according to the teachings of the aforesaid document EP 3178783. By way of example, only a first driving arm 11a and a second driving arm 11b that belong to the aforesaid two sets driven in phase opposition are illustrated, and moreover highlighted is a biasing voltage V applied to just one of the aforesaid driving arms (in the example, the first driving arm 11a).

The aforesaid first driving arm 11a has a first end connected to the second driving arm 11b and a second end connected to the tiltable structure 12, which carries a mirror surface 13, at a corresponding end or edge portion thereof.

As illustrated in FIG. 2B, application of the biasing voltage V causes bending out of the horizontal plane (along an orthogonal axis Z) of the first driving arm 11a and in particular of the second end connected to the tiltable structure 12. Consequently, also the same tiltable structure 12 undergoes a corresponding out-of-plane displacement.

Given that the extent of the out-of-plane displacement of the tiltable structure 12 is substantially equal to the overall bending of the driving arms, it is evident why the spring elements have a shape folded to form a spiral, with a plurality of driving arms, thus enabling at the same time maximization of the extent of the aforesaid displacement.

Mirror devices with piezoelectric actuation have the advantage of requiring actuation voltages and power-consumption levels reduced as compared to devices with electrostatic or electromagnetic actuation.

However, the Inventors have realized that known solutions for mirror devices with piezoelectric actuation generally have a high sensitivity to spurious out-of-plane movements (along the orthogonal axis Z). The driving arms, on which the piezoelectric bands are provided, are in fact thin and have a great length (as mentioned previously, in order to achieve high values of displacement), thus causing the presence of multiple spurious modes even at low frequency (i.e., at frequencies close to the frequency of the driving movement, for example around 100 Hz).

Moreover, once again on account of the length of the driving arms (arranged in folded configuration), the structure proves particularly subject to impact and shock along the axis Z.

There is a need in the art to provide a microelectromechanical device with actuation of a piezoelectric type that will enable the drawbacks of the prior art to be overcome.

SUMMARY

The microelectromechanical device includes a fixed structure defining a cavity, a tiltable structure elastically suspended in the cavity with a main extension in a horizontal plane, and a piezoelectrically driven actuation structure interposed between the tiltable and fixed structures, causing rotation about a first rotation axis parallel to a first horizontal axis. The actuation structure includes a first pair of driving arms with piezoelectric material, elastically coupled to the tiltable structure by respective decoupling elastic elements that are stiff for out-of-plane movements but compliant for torsional movements about the first rotation axis.

The decoupling elastic elements are coupled to the tiltable structure near the first rotation axis and extend between the driving arms and tiltable structure at respective coupling points. The distance between these coupling points and the first rotation axis is smaller than the distance between the coupling points and an edge end of the tiltable structure along a second horizontal axis.

The decoupling elastic elements are of a folded type. The fixed structure forms a frame in the horizontal plane, surrounding the cavity, and includes first and second supporting elements extending longitudinally along the first rotation axis. Elastic suspension elements connect the tiltable structure and supporting elements.

The device also features a first lever mechanism coupled between the first supporting element and a first driving arm, including a lever arm, a torsional elastic element, and a coupling element with a first pair of piezoresistors, forming a piezoresistive sensor. Additionally, a second lever mechanism is symmetrically arranged and coupled to the first supporting element and a second driving arm, with a respective lever arm, torsional elastic element, and coupling element with a second pair of piezoresistors, together defining the piezoresistive sensor.

Conductive paths connect the piezoresistors of the first and second pairs in a Wheatstone bridge configuration and to electrical-contact pads. The first pair of piezoresistors forms the first half-bridge, while the second pair forms the second half-bridge of the Wheatstone bridge.

The microelectromechanical device includes driving arms with a first end elastically coupled to the tiltable structure by respective decoupling elastic elements and a second end fixedly coupled to the fixed structure. The driving arms have a main extension along the first rotation axis or parallel to a second horizontal axis orthogonal to the first horizontal axis.

The device also features a second pair of driving arms symmetrically arranged with respect to the first pair, carrying piezoelectric material and elastically coupled to the tiltable structure by respective decoupling elastic elements. The driving arms have a generally C-shaped conformation with a major side extending longitudinally parallel to the first rotation axis and minor sides extending parallel to the second horizontal axis.

Electrical-contact pads are carried by the fixed structure, connected to the piezoelectric material of the driving arms for electrical biasing. The tiltable structure is configured to perform rotation movements about both the first and second rotation axes, and has an inner frame defining a window, elastically coupled to the driving arms, and a supporting element housed in the window, elastically coupled to the inner frame by elastic elements. The piezoelectrically driven actuation structure includes additional regions of piezoelectric material for causing rotation about the second rotation axis.

Lastly, the tiltable structure carries a reflecting surface, thereby providing a mirror structure.

Also disclosed herein is a microelectromechanical device that includes a fixed structure defining a cavity, a tiltable structure elastically suspended within the cavity, and a piezoelectrically driven actuation structure that rotates the tiltable structure about a first rotation axis. The actuation structure includes driving arms with piezoelectric material, elastic suspension elements, and a first lever mechanism with a piezoresistive sensor.

Additionally, the device features a second lever mechanism symmetrically arranged with respect to the first, coupled between a supporting element and a driving arm. The first and second lever mechanisms have lever arms with longitudinal extensions along the first horizontal axis and torsional elastic elements coupled to coupling elements integral with the supporting element. The first and second pairs of piezoresistors define the piezoresistive sensor.

Conductive paths on the supporting element connect the piezoresistors in a Wheatstone bridge configuration and connect them to electrical-contact pads. The first pair of piezoresistors forms the first half-bridge, and the second pair forms the second half-bridge of the Wheatstone bridge.

BRIEF DESCRIPTION OF THE DRAWINGS

For a better understanding, embodiments are now described, purely by way of non-limiting example, with reference to the attached drawings, wherein.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown but is to be accorded the widest scope consistent with the principles and features disclosed or suggested herein.

Figure 3:
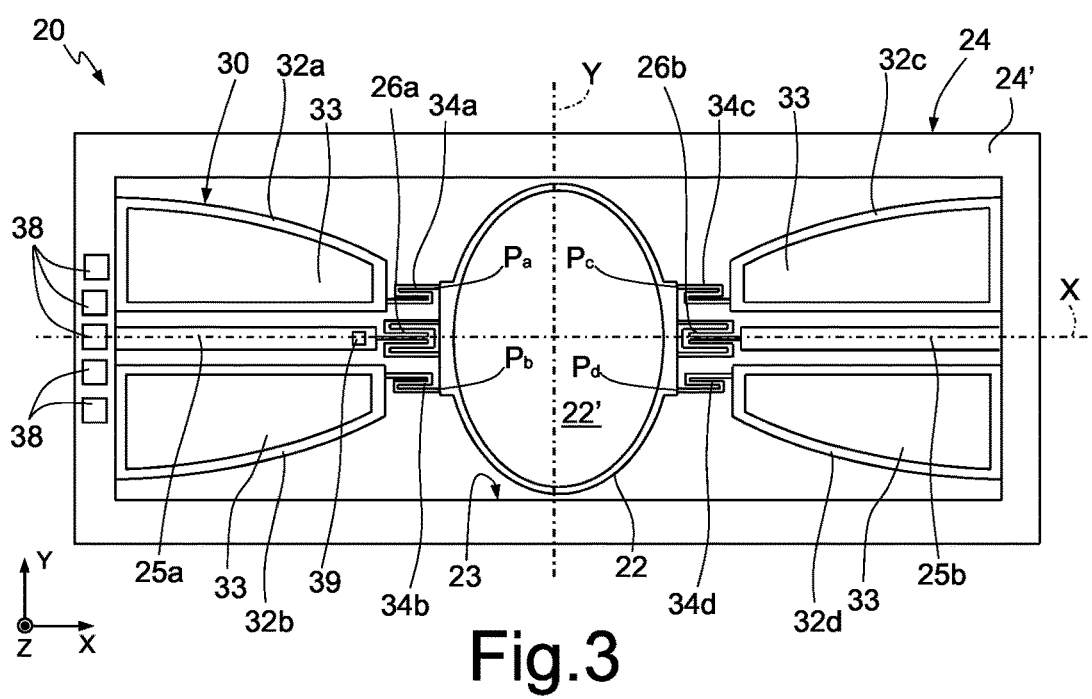
FIG. 3 is a schematic top plan view of a microelectromechanical device according to a first embodiment of the present solution.

FIG. 3 is a schematic illustration of a microelectromechanical device 20, in particular a mirror device based on MEMS technology, according to a first embodiment of the present solution.

Figure 1A:
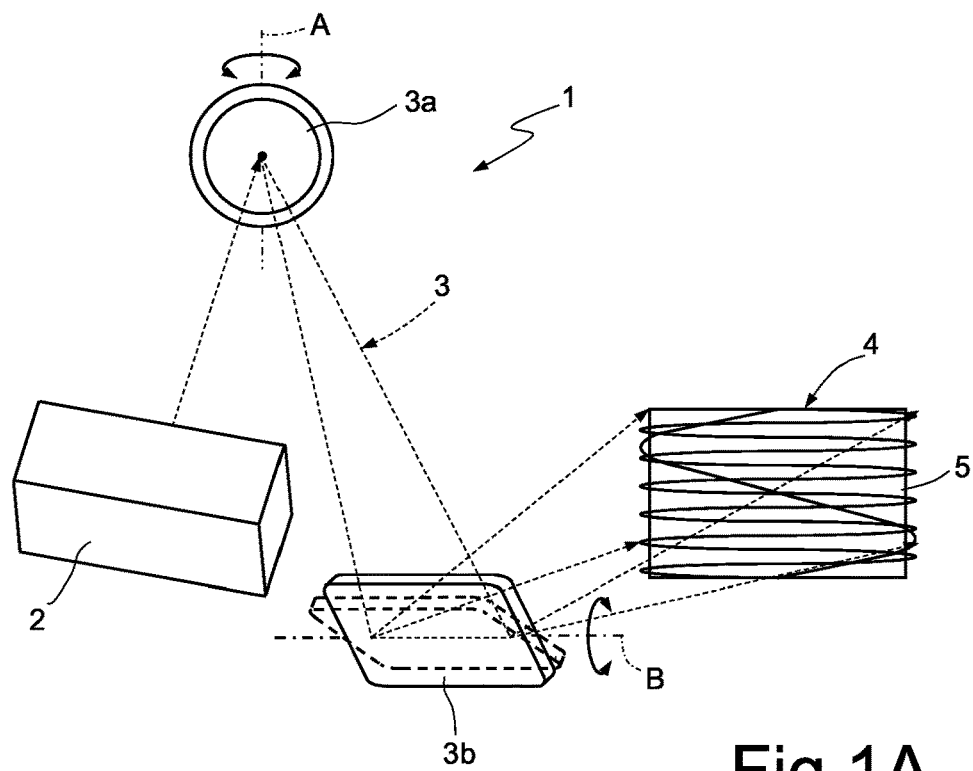
FIGS. 1A-1B are schematic illustrations of respective pico-projectors with a pair of uniaxial mirror devices or with a single biaxial mirror device.

The microelectromechanical device 20 is formed in a die of semiconductor material, in particular silicon, and is provided with a tiltable structure 22, having a main extension in a horizontal plane XY and arranged so as to rotate about a first rotation axis, parallel to a first horizontal axis X of the aforesaid horizontal plane XY (for example, the first rotation axis corresponds to the horizontal rotation axis B of a pico-projector apparatus—see FIG. 1A).

The aforesaid first rotation axis represents a first median axis of symmetry X for the microelectromechanical device 20. A second median axis of symmetry Y for the same microelectromechanical device 20 is parallel to a second horizontal axis Y, orthogonal to the first horizontal axis X and defining, with the first horizontal axis X, the horizontal plane XY.

The tiltable structure 22 is suspended above a cavity 23, provided in the die, and has, in the embodiment illustrated, a generically elliptical shape in the horizontal plane XY, with major axis arranged along the second median axis of symmetry Y. The tiltable structure 22 defines a supporting structure that carries, at the top, a reflecting surface 22' so as to define a mirror structure.

The tiltable structure 22 is elastically coupled to a fixed structure 24, defined in the same die. In particular, the fixed structure 24 forms, in the horizontal plane XY, a frame 24' that delimits and surrounds the aforesaid cavity 23 and moreover has a first supporting element 25a and a second supporting element 25b, which extend longitudinally along the first median axis of symmetry X within the cavity 23 starting from the same frame 24', on opposite sides of the tiltable structure 22.

The tiltable structure 22 is supported by the first and the second supporting elements 25a, 25b, to which it is elastically coupled, respectively, by means of a first elastic suspension element 26a and a second elastic suspension element 26b, which have a high stiffness in regard to movements out of the horizontal plane XY (along an orthogonal axis Z, transverse to the horizontal plane XY) and are compliant in regard to torsion about the first horizontal axis X. The first and the second elastic suspension elements 26a, 26b hence extend along the first median axis of symmetry X, between the first, respectively second, supporting element 25a, 25b and a facing side of the tiltable structure 22, to which they are coupled at a corresponding central portion.

In the embodiment illustrated, the first and the second elastic suspension elements 26a, 26b are of a folded type, i.e., they are formed by a plurality of arms having a longitudinal extension parallel to the first horizontal axis X, connected two by two at the ends by connecting elements (having an extension parallel to the second horizontal axis Y).

Advantageously, the first and the second elastic suspension elements 26a, 26b couple the tiltable structure 22 to the fixed structure 24, enabling rotation thereof about the first rotation axis and providing a high stiffness in regard to movements out of the plane, hence guaranteeing a high ratio between the frequencies of spurious movements out of the horizontal plane XY and the frequency of rotation about the first rotation axis.

The microelectromechanical device 20 further comprises an actuation structure 30, coupled to the tiltable structure 22 and configured to cause rotation thereof about the first rotation axis. The actuation structure 30 is interposed between the tiltable structure 22 and the fixed structure 24 and moreover contributes to supporting the tiltable structure 22 above the cavity 23.

The actuation structure 30 comprises at least one first pair of driving arms formed by a first driving arm 32a and a second driving arm 32b, which are arranged on opposite sides of, and symmetrically with respect to, the first median axis of symmetry X and first supporting element 25a, and here have a longitudinal extension parallel to the first horizontal axis X and to the aforesaid first supporting element 25a.

In the embodiment illustrated in FIG. 3, the driving arms 32a, 32b have a generically trapezoidal (or fin-like) shape, with a major side directed parallel to the second horizontal axis Y fixedly coupled to the frame 24' of the fixed structure 24 and a minor side directed parallel to the same second horizontal axis Y elastically coupled to the tiltable structure 22.

Each driving arm 32a, 32b is suspended above the cavity 23 and carries, on a top surface thereof (opposite to the same cavity 23), a respective first region made of piezoelectric material 33 (e.g., PZT—lead zirconate titanate), having substantially the same extension in the horizontal plane XY as the driving arm 32a, 32b. Each driving arm 32a, 32b moreover has a respective first end, fixedly coupled to the frame 24' of the fixed structure 24, and a respective second end, elastically coupled to the tiltable structure 22, by means of a first and a second decoupling elastic element 34a, 34b, respectively.

In the example illustrated, the frame 24' has a substantially rectangular shape in the horizontal plane XY, and the first end of the driving arms 32a, 32b is fixedly coupled to the sides of the same frame 24' having an extension parallel to the second horizontal axis Y (in a direction transverse to the first rotation axis of the tiltable structure 22).

The aforesaid first and second decoupling elastic elements 34a, 34b have a high stiffness in regard to movements out of the horizontal plane XY (along the orthogonal axis Z) and are compliant in regard to torsion (about a rotation axis parallel to the first horizontal axis X). The first and the second decoupling elastic elements 34a, 34b hence extend parallel to the first horizontal axis X, between the first and the second driving arms 32a, 32b, respectively, and a same side facing the tiltable structure 22.

In particular, as is illustrated in the aforesaid FIG. 3, the first and second decoupling elastic elements 34a, 34b are coupled to the tiltable structure 22 at a respective coupling point Pa, Pb, which is located in the proximity of the first median axis of symmetry X, at a short distance d from the same first median axis of symmetry X. For instance, this distance d may range between 10 µm and 1500 µm in a typical embodiment and may moreover be in general between 1/10 and 1/2 of the main dimension (in the example, along the second median axis of symmetry Y) of the tiltable structure 22.

In any case, the distance between the respective coupling point Pa, Pb and the first median axis of symmetry X is preferably smaller, in particular much smaller, than the distance between the same coupling point Pa, Pb and end or edge portions (considered along the second median axis of symmetry Y) of the tiltable structure 22. In fact, the closer these coupling points Pa, Pb are to the first rotation axis, the greater the ratio between the vertical displacement of the end of the tiltable structure 22 and the vertical displacement of the driving arms 32a, 32b, caused by the piezoelectric effect (as it is discussed in detail hereinafter).

Each elastic suspension element 26 has a first folded part elastically coupling the end of supporting element 25 to the tiltable structure on one side of the axis X and a second folded part elastically coupling the end of supporting element 25 to the tiltable structure on an opposite side of the axis X. The coupling locations for the first and second folded parts of the elastic suspension element 26 are positioned between the axis X and the respective coupling points Pa, Pb.

In the embodiment illustrated in FIG. 3, the first and the second decoupling elastic elements 34a, 34b are also of a folded type; i.e., they are formed by a plurality of arms having a longitudinal extension parallel to the first horizontal axis X, connected two by two by connecting elements (having an extension parallel to the second horizontal axis Y).

In the embodiment illustrated in FIG. 3, the aforesaid actuation structure 30 further comprises a second pair of driving arms formed by a third driving arm 32c and a fourth driving arm 32d, which are arranged on opposite sides of the first median axis of symmetry X and, this time, of the second supporting element 25b, and have a longitudinal extension parallel to the first horizontal axis X and to the aforesaid second supporting element 25b (it should be noted that the second pair of driving arms 32c, 32d is hence arranged symmetrically to the first pair of driving arms 32a, 32b with respect to the second median axis of symmetry Y).

As it has been discussed for the first pair of driving arms 32a, 32b, each driving arm 32c, 32d of the second pair carries, on a top surface thereof, a respective first region made of piezoelectric material 33 (e.g., PZT—lead zirconate titanate) and has a respective first end fixedly coupled to the frame 24' of the fixed structure 24 and a respective second end elastically coupled to the tiltable structure 22, by means of a third and a fourth decoupling elastic element 34c, 34d, respectively (which are arranged on the opposite side of the first and the second decoupling elastic elements 32a, 32b with respect to the second median axis of symmetry Y).

The aforesaid third and fourth decoupling elastic elements 34c, 34d also have a high stiffness in regard to movements out of the horizontal plane XY (along the orthogonal axis Z) and are compliant in regard to torsion (about a rotation axis parallel to the first horizontal axis X).

In particular, as is illustrated in the aforesaid FIG. 3, also the third and fourth decoupling elastic elements 34c, 34d are hence coupled to the tiltable structure 22 at a respective coupling point Pc, Pd, which is located in the proximity of the first rotation axis, at the short distance d from the same first rotation axis. Moreover, also the third and fourth decoupling elastic element 34c, 34d are of a folded type.

As illustrated schematically in the aforesaid FIG. 3, the microelectromechanical device 20 further comprises a plurality of electrical-contact pads 38, which are carried by the fixed structure 24 at the frame 24' and are electrically connected (in a way not illustrated in detail in FIG. 3) to the first regions of piezoelectric material 33 of the driving arms 32a-32d, to enable electrical biasing thereof by electrical signals coming from outside of the electromechanical device 20 (for example, supplied by a biasing device of an electronic apparatus in which the electromechanical device 20 is integrated).

Moreover, the microelectromechanical device 20 comprises a piezoresistive (PZR) sensor 39, appropriately arranged so as to provide a detection signal associated with rotation of the tiltable structure 22 about the first rotation axis. This detection signal can be provided as a feedback to the outside of the microelectromechanical device 20, for example to the aforesaid biasing device, through at least one of the electrical-contact pads 38.

In the embodiment illustrated in FIG. 3, the piezoresistive sensor 39 is provided (for example, by surface diffusion of dopant atoms) on the first supporting element 25a (different arrangements may, however, be envisaged for the same piezoresistive sensor 39).

Advantageously, the elastic suspension elements 26a, 26b are able to transmit the stresses to the supporting elements 25a, 25b and hence towards the piezoresistive sensor 39, enabling arrangement of the latter on the supporting elements 25a, 25b and a consequent simplification of routing of the electrical connections to the electrical-contact pads 38.

Figure 4A:
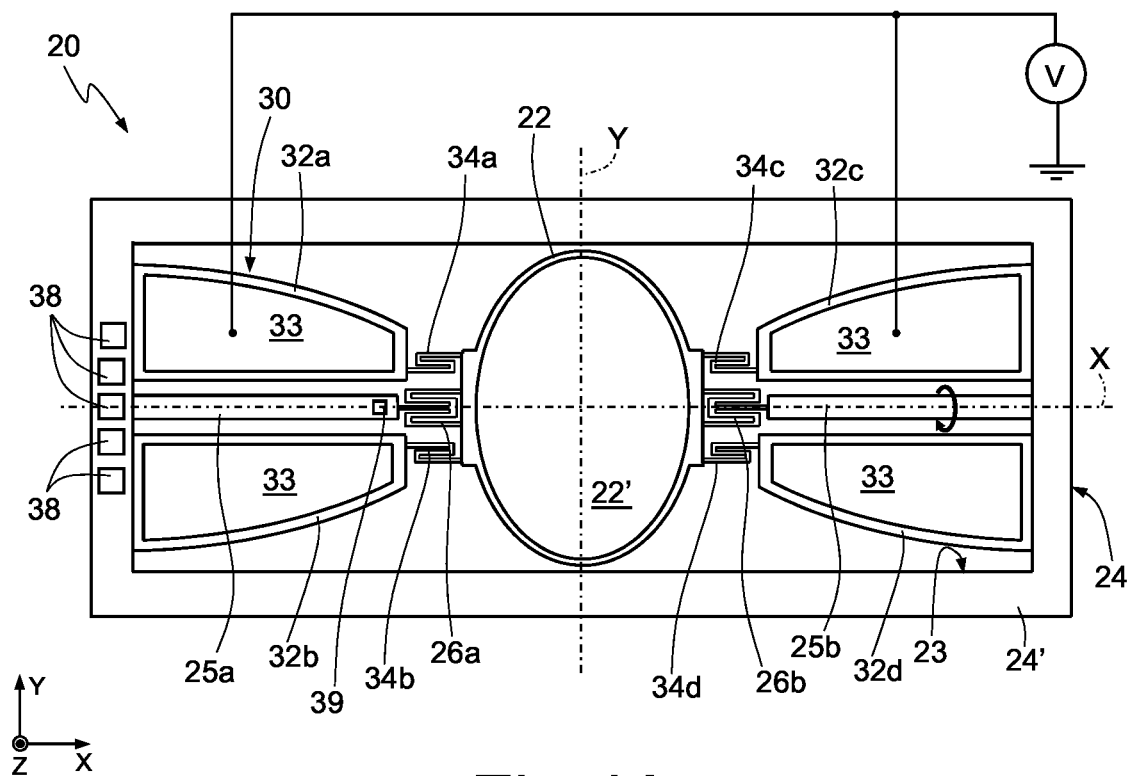
FIGS. 4A-4B are schematic illustrations of the microelectromechanical device of FIG. 3 with a first rotation movement of a corresponding tiltable structure.
Figure 4B:
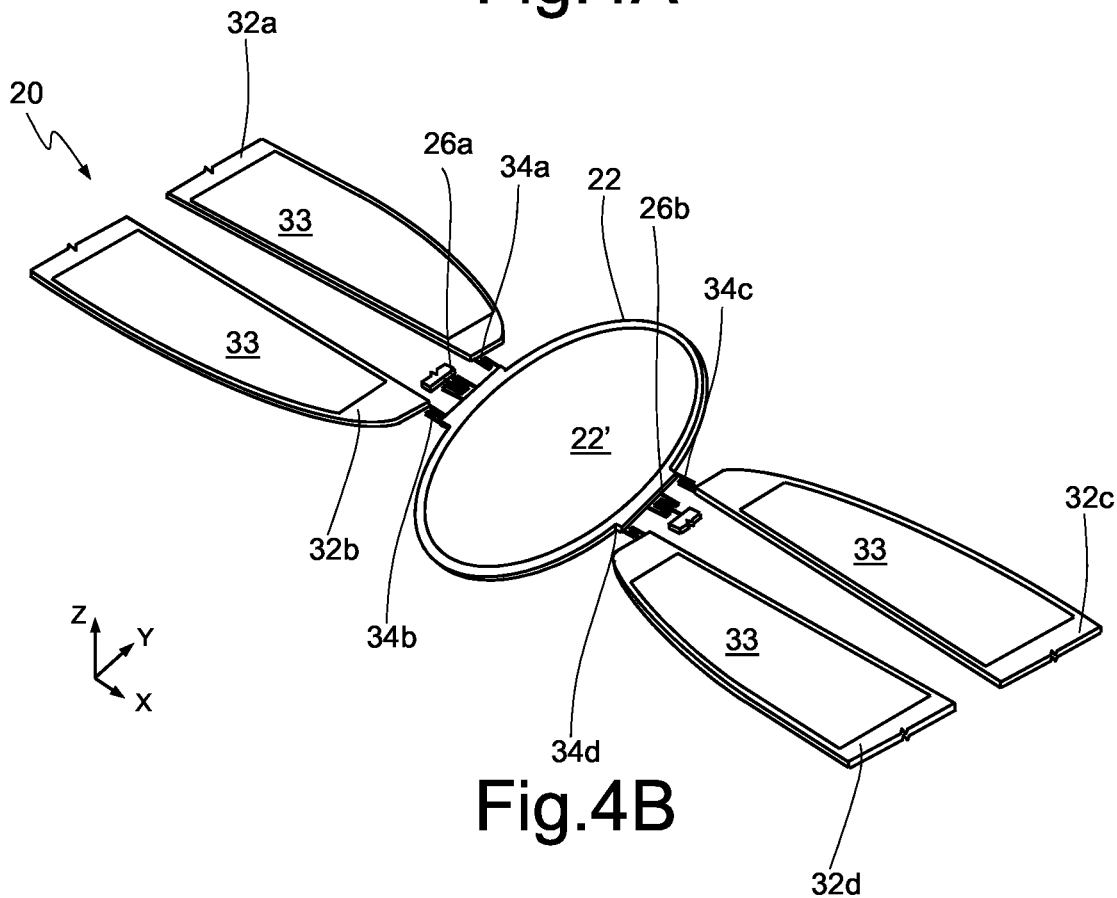

During operation of the microelectromechanical device 20, application of a biasing voltage V to the first region of piezoelectric material 33 of the first driving arm 32a (having a positive value with respect to the biasing of the first region of piezoelectric material 33 of the second driving arm 32b, which may, for example, be connected to a ground reference potential), causes a rotation of a positive angle about the first rotation axis (parallel to the first horizontal axis) X, as illustrated in FIGS. 4A and 4B.

Figure 5A:
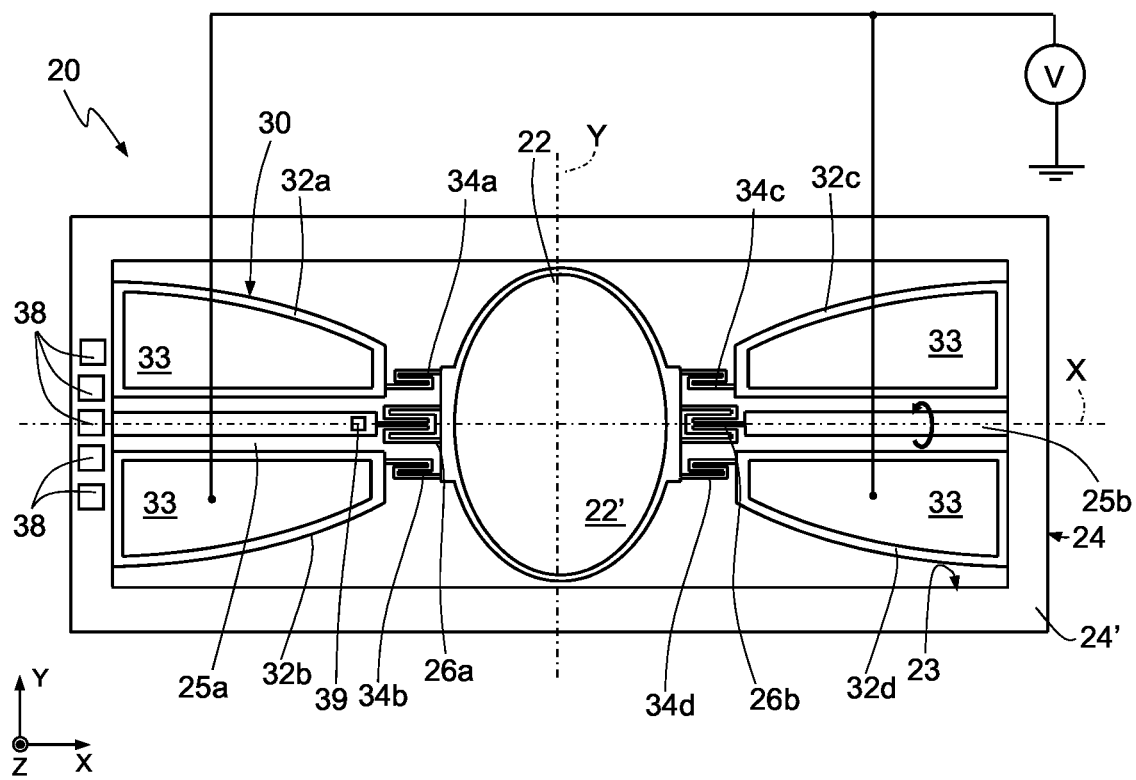
FIGS. 5A-5B are schematic illustrations of the microelectromechanical device of FIG. 3 with a second rotation movement of the corresponding tiltable structure.
Figure 5B:
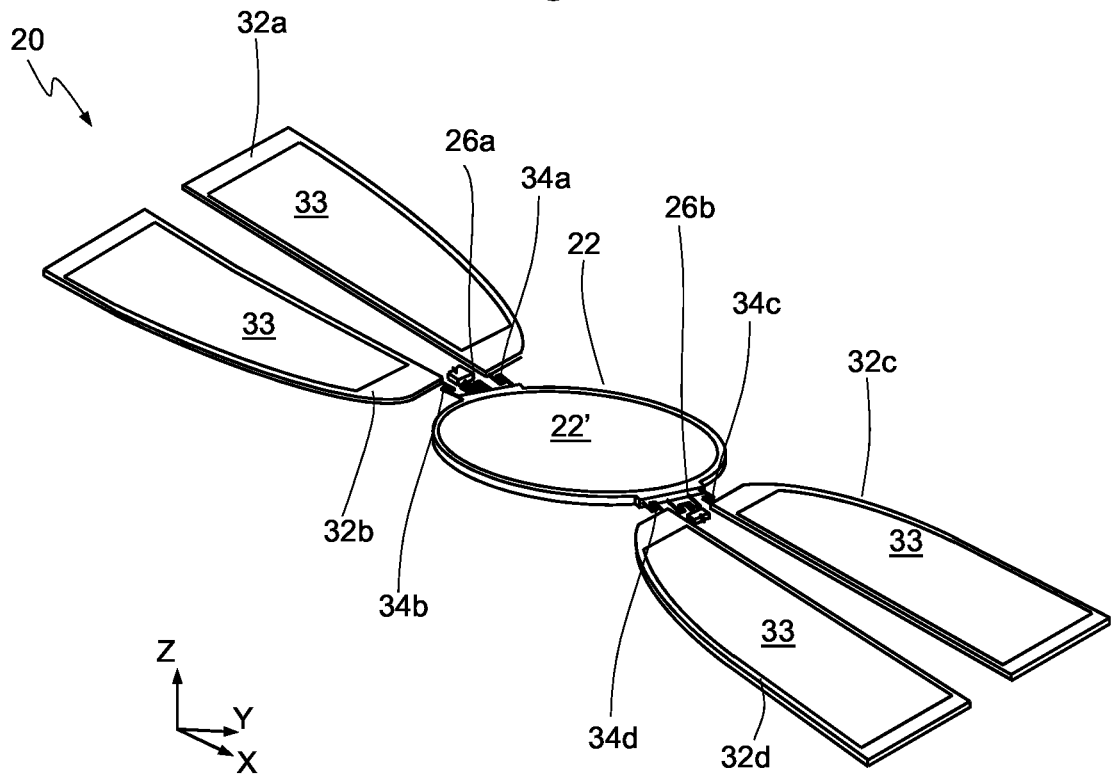

In a corresponding manner, application of a biasing voltage V to the first region of piezoelectric material 33 of the second driving arm 32b (having a positive value with respect to the biasing of the first region of piezoelectric material 33 of the first driving arm 32a, which may, for example, in this case be connected to a ground reference potential), causes a corresponding rotation of a negative angle about the same first rotation axis, as illustrated in FIGS. 5A and 5B.

It should be noted that the same biasing voltage V is applied to the first region of piezoelectric material 33 both of the first driving arm 32a and of the third driving arm 32c, and, likewise, in order to cause rotation in the opposite direction, to the first region of piezoelectric material 33, of both the second driving arm 32b and the fourth driving arm 32d, so as to contribute in a corresponding manner to the rotation of the tiltable structure 22 about the first rotation axis (as on the other hand emerges clearly from the foregoing description).

Advantageously, the decoupling elastic elements 34a-34d elastically decouple displacement by the piezoelectric effect of the driving arms 32a-32d along the orthogonal axis Z from the consequent rotation of the tiltable structure 22 along the first rotation axis.

In particular, by virtue of the proximity of the coupling points Pa-Pd between the decoupling elastic elements 34a-34d and the tiltable structure 22 to the rotation axis, a wide angle of rotation of the tiltable structure 22 about the first rotation axis corresponds to a small displacement out of the horizontal plane XY of the aforesaid driving arms 32a-32d (as on the other hand is highlighted in the aforesaid FIGS. 4B and 5B), or, likewise, a large displacement out of the horizontal plane XY of the end portions (considered along the second horizontal axis Y) of the same tiltable structure 22. For example, the ratio between the extent of these displacements may be equal to five in a possible embodiment.

The tiltable structure 22 can reach wide tilting angles (for example, greater than 10°) with a low value of the biasing voltage V (for example, lower than 40 V).

Moreover, the maximum amount of stress occurs in the elastic suspension elements 26a, 26b that couple the tiltable structure 22 to the fixed structure 24; the Inventors have found that stresses of this amount can be withstood without any problem and fall within the design requirements.

Tests and simulations carried out by the Inventors have shown that the microelectromechanical device 20 shows improved mechanical and electrical characteristics as compared to known devices.

In particular, the first spurious mode, due to the movement out of the plane of the tiltable structure 22, in this case has a frequency that is much higher than the frequency of the main mode, represented by rotation about the first rotation axis (for example, the ratio between the two frequencies is higher than four), unlike known solutions in which these frequencies have comparable values.

Moreover, also by virtue of the small displacement in the direction of the orthogonal axis Z of the driving arms 32a-32d (this displacement being smaller even by a factor of ten as compared to traditional solutions), the microelectromechanical device 20 is less subject to shock acting along the orthogonal axis Z (in other words, a same shock causes a level of stress and a displacement out of the horizontal plane XY much smaller in the present microelectromechanical device 20 than in known solutions).

A possible embodiment of the piezoresistive sensor 39 is now described in greater detail, configured to detect the rotation of the tiltable structure 22 about the first rotation axis.

The Inventors have realized that the stress transferred by the elastic suspension elements 26a, 26b to the supporting elements 25a, 25b can be limited by the elastic characteristics of the same elastic suspension elements 26a, 26b, which in fact are generally thin and compliant to ensure the desired range of movement of the tiltable structure 22.

Figure 6:
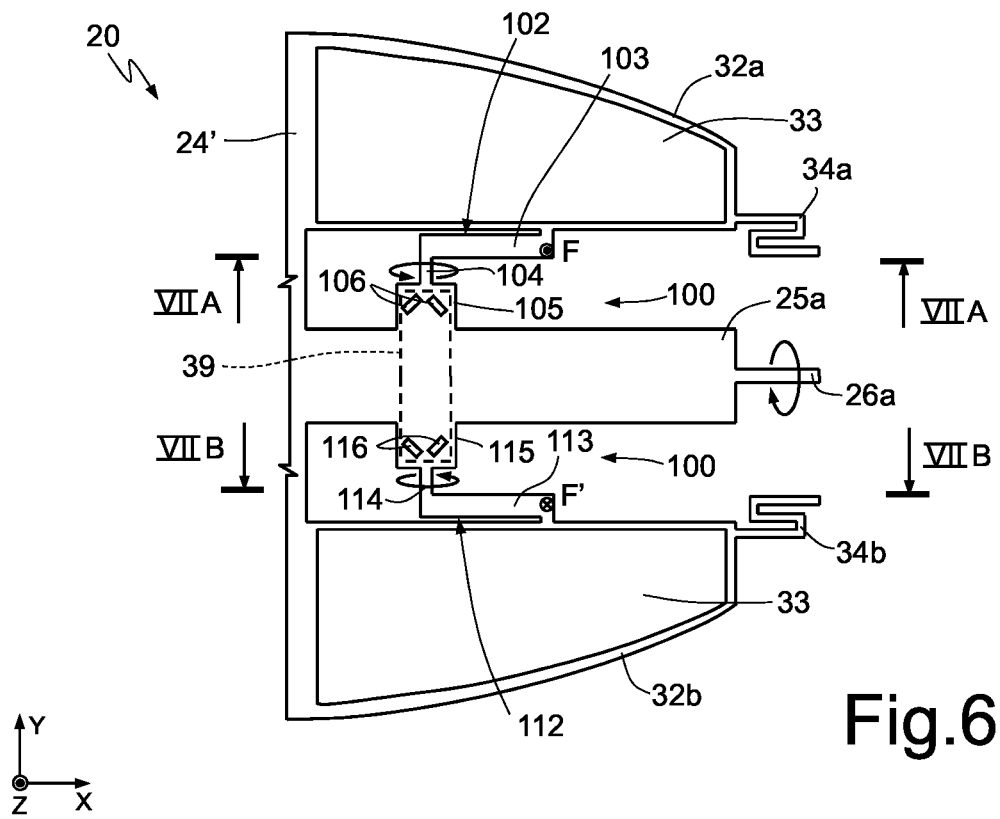
FIG. 6 is a schematic top plan view of a portion of the microelectromechanical device of FIG. 3, according to a further aspect of the present solution.

In a particular embodiment, shown in FIG. 6, an additional mechanical amplification structure, denoted with 100, is therefore provided, configured to maximize the sensitivity of the piezoresistive sensor 39.

This mechanical amplification structure 100 comprises a first lever mechanism 102, coupled, in the illustrated example, between the first supporting element 25a and the first driving arm 32a.

In detail, the first lever mechanism 102 comprises a lever arm 103 having a longitudinal extension (along the first horizontal axis X) and a first end coupled to the first driving arm 32a and a second end coupled, by means of a torsional elastic element 104 (in the example having extension along the second horizontal axis Y), to a coupling element 105, fixed and integral with the first supporting element 25a (of which constitutes a protrusion towards the aforesaid first driving arm 32a).

A first pair of diffused piezoresistors 106 of the aforementioned piezoresistive sensor 39 are formed in this coupling element 105.

Figure 7A:
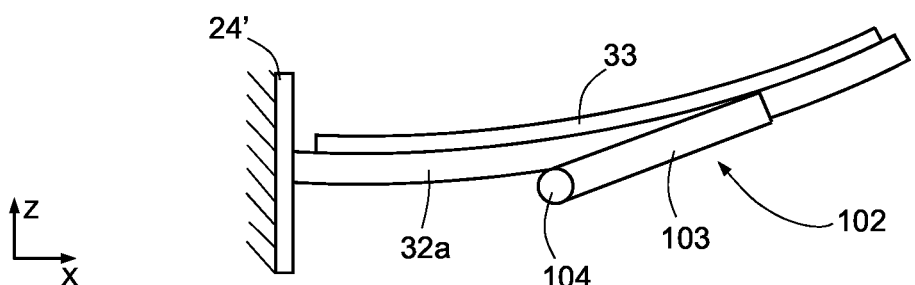
FIGS. 7A and 7B are schematic cross-section views of parts of the microelectromechanical device shown in FIG. 6, during a respective detection movement.

During operation, and as shown schematically in FIG. 7A, the movement of the first driving arm 32a (due to biasing of the respective first region of piezoelectric material 33) determines a corresponding movement out of the horizontal plane XY (in the example an upwards movement) of the lever arm 103, in particular of the corresponding first end (at which a force F is generated). A torsion of the torsional elastic element 104 is consequently generated, in the example clockwise around the same torsional elastic element 104.

The diffused piezoresistors 106 of the first pair are arranged so as to detect the stress resulting from the aforementioned rotation of the torsional elastic element 104, which is therefore indicative of the rotation of the tiltable structure 22. In particular, the presence of the first lever mechanism 102 advantageously allows to amplify the stress detected by the diffused piezoresistors 106.

As shown in the same FIG. 6, advantageously, the mechanical amplification structure 100 further comprises a second lever mechanism 112, coupled between the same first supporting element 25a and, this time, the second driving arm 32b, thus being arranged in a symmetrical manner to the first lever mechanism 102 with respect to the first horizontal axis X.

In a similar manner, the second lever mechanism 112 comprises a respective lever arm 113 having a longitudinal extension (along the first horizontal axis X) and a respective first end coupled to the second driving arm 32b and a respective second end coupled, by means of a respective torsional elastic element 114 (in the example having an extension along the second horizontal axis Y), to a respective coupling element 115, fixed and integral with the first supporting element 25a (of which constitutes a protrusion towards the aforesaid second driving arm 32b); the coupling elements 105, 115 are therefore symmetrical with respect to the first horizontal axis X.

A second pair of diffused piezoresistors 116 of the piezoresistive sensor 39 are formed at the aforesaid respective coupling element 115.

Figure 7B:
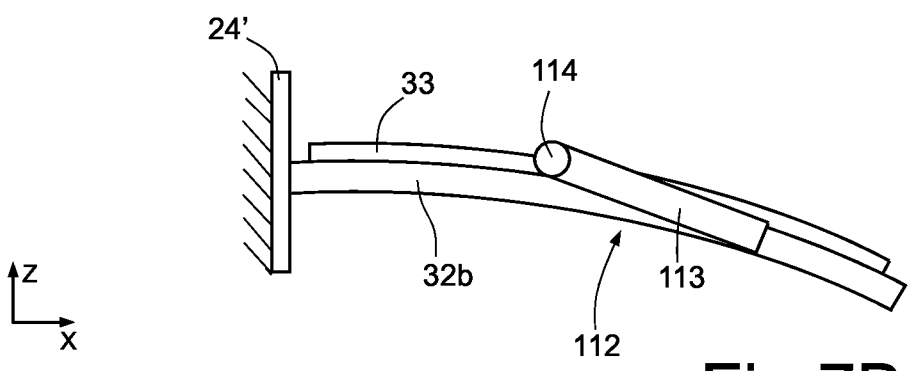

During operation, and as shown schematically in FIG. 7B, movement of the second driving arm 32b (due to biasing of the respective region of piezoelectric material 33) determines a corresponding movement outside the horizontal plane XY (in the example a downwards movement) of the lever arm 113, in particular of the corresponding first end (at which a respective force F' is generated). A torsion of the torsional elastic element 114 of the second lever mechanism 112 is consequently generated, in the example counterclockwise around the same torsional elastic element 114.

The diffused piezoresistors 116 of the second pair are arranged so as to detect the stress resulting from the aforementioned rotation of the torsional elastic element 114.

Figure 8A:
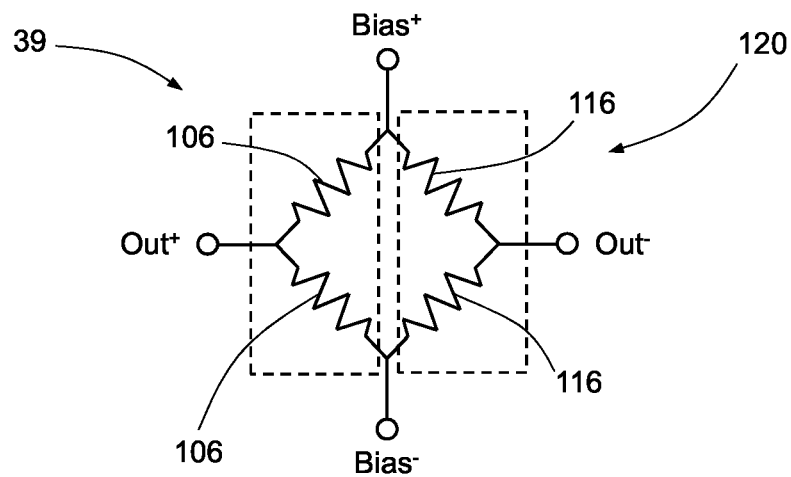
FIG. 8A is an equivalent electrical diagram of connections between diffused piezoresistors in the microelectromechanical device shown in FIG. 6.

In particular, as shown in the equivalent electric diagram of FIG. 8A, the diffused piezoresistors 106 of the first pair may constitute a first half of a detection Wheatstone bridge, denoted as 120, of the piezoresistive sensor 39, while the diffused piezoresistors 116 of the second pair may in this case constitute the second half of the same detection Wheatstone bridge 120.

Figure 8B:
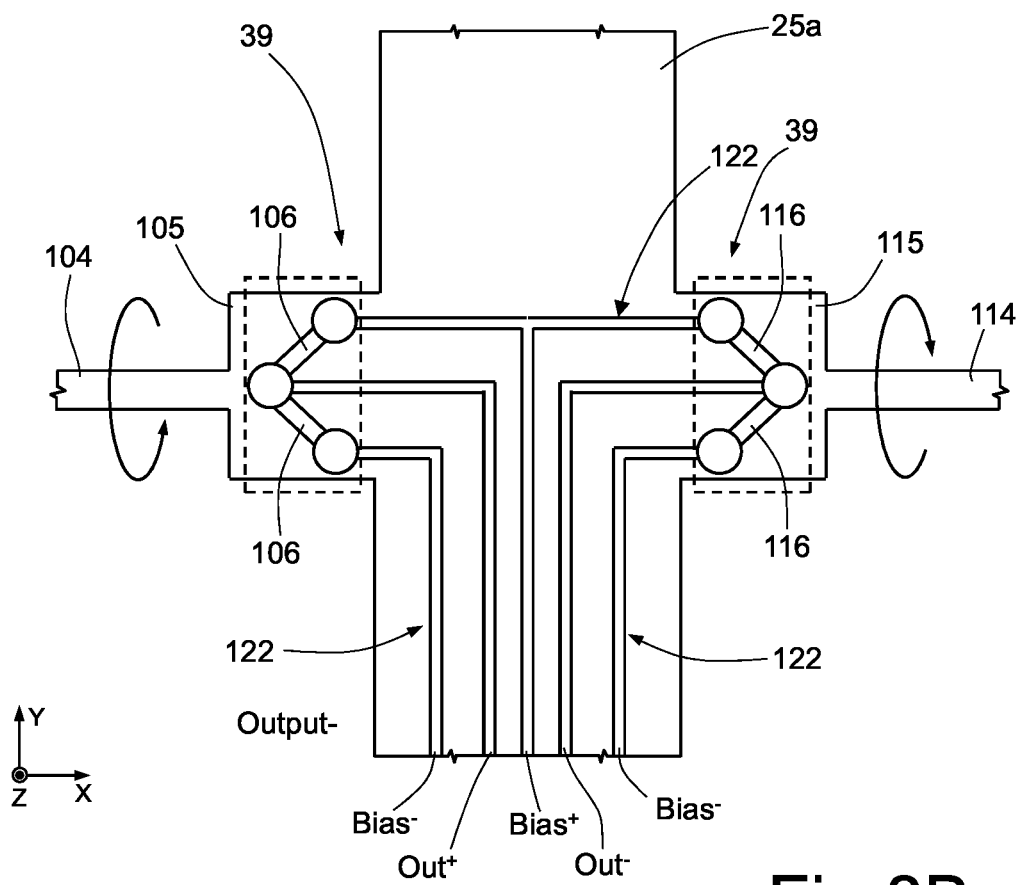
FIG. 8B is a schematic top plan view of a part of the microelectromechanical device of FIG. 6, showing electrical connections between the diffused piezoresistors.

As shown schematically also in FIG. 8B, suitable conductive paths 122 are formed in the first supporting element 25a (for example being constituted by surface metal traces), so as to connect the diffused piezoresistors 106, 116 of the first and second pairs together according to the Wheatstone bridge connection scheme, and also so as to connect the same diffused piezoresistors 106, 116 to associated electrical-contact pads 38 (here not shown).

In particular, a common end of the diffused piezoresistors 106 of the first pair is electrically connected to a first output (positive, in the example) of the Wheatstone bridge (denoted with 'Out+' in the aforementioned FIG. 8A), while the ends not in common are connected electrically to a first and a second biasing voltage (for example a positive voltage Bias+ and a negative voltage Bias-).

Similarly, a common end of the diffused piezoresistors 116 of the second pair is electrically connected to a second output (negative in the example) of the Wheatstone bridge (denoted with Out-), while the ends not in common are electrically connected to the same first and second biasing voltages (the positive voltage Bias+ and the negative voltage Bias-).

Advantageously, the presence of the two fully symmetrical halves of the detection Wheatstone bridge 120 allows to detect the opposite displacements of the first and second lever mechanisms 102, 112, thereby maximizing and making symmetrical the detection and the corresponding detection signal provided at the output (outside of the microelectromechanical device 20).

Electrical-contact pad 38 (here not shown) are suitably coupled to the aforesaid conductive paths 122, which provide the routing of the electrical connections to the same electrical-contact pads 38.

This embodiment advantageously allows to maximize the detection sensitivity of the piezoresistive sensor 39, thus ensuring a more effective control of the electromechanical device (for example, by the electronic apparatus in which the same electromechanical device 20 is integrated).

Figure 9:
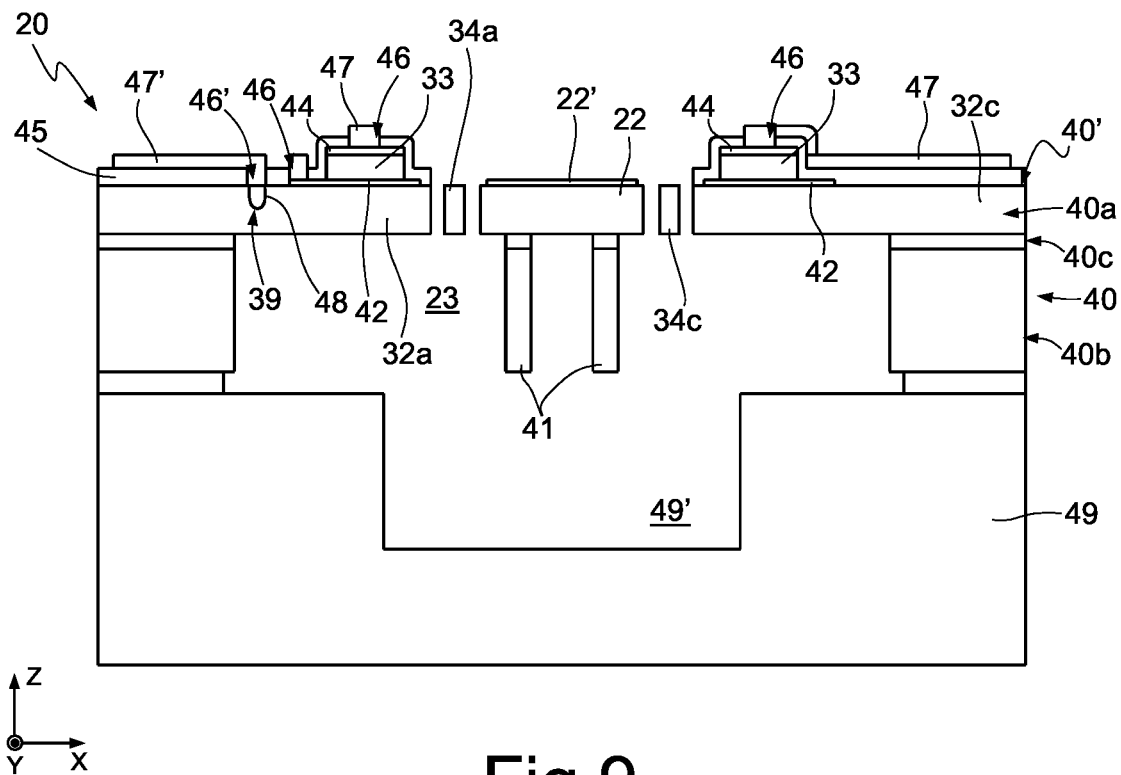
FIG. 9 is a cross-section view of a possible implementation of the microelectromechanical device, starting from a SOI (Silicon-On-Insulator) wafer.

With reference to FIG. 9, a cross-section view provided by way of example of a possible implementation of the microelectromechanical device 20 is now illustrated, in this case obtained starting from a SOI (Silicon-On-Insulator) wafer 40 made of semiconductor material, in particular silicon.

In a way that will be clear to a person skilled in the art, the tiltable structure 22, the fixed structure 24, the elastic elements 34-34d, and the driving arms 32a-32d are defined by chemical etching in an active layer 40a of the SOI wafer 40 (e.g., having a thickness of 20 μm). The cavity 23 is formed, once again by chemical etching, in a rear layer 40b of the SOI wafer 40 (e.g., having a thickness of 140 μm) and in a dielectric layer 40c of the same SOI wafer 40.

It should be noted that underneath the tiltable structure 22, following upon etching for the formation of the cavity 23, there remain reinforcement elements 41, having an extension along the orthogonal axis Z and operating as mechanical reinforcement.

Formed on a top surface 40' of the active layer 40a of the SOI wafer 40 are: the reflecting surface 22', on the mobile structure 22, made of an appropriate material (e.g., aluminum, or else gold, according to whether projection is in the visible or in the infrared); and moreover, bottom electrode regions 42, made of an appropriate conductive material, on the driving arms 32a-32d.

The first regions of piezoelectric material 33 (constituted by a thin film of PZT) are formed on the aforesaid bottom electrode regions 42, and top electrode regions 44 are formed on the first regions of piezoelectric material 33.

A passivation layer 45, made of an appropriate dielectric material, is formed, as a cover, on the active layer 40a of the SOI wafer, and contact openings 46 are opened through the same passivation layer 45 so as to enable access to the aforesaid bottom electrode regions 42 and top electrode regions 44.

Metal routing regions 47 are then formed on the passivation layer 45 so as to contact, through the contact openings 46, the bottom and top electrode regions 42, 44, moreover extending as far as respective electrical-contact pads 38 (here not illustrated).

Through the above passivation layer 45 a further contact opening 46' is moreover formed, in order to reach a diffused region 48, arranged at the front surface 40' of the active layer 40a of the wafer 40, which defines the PZR sensor 39. A further metal routing region 47' is formed on the passivation layer 45, so as to contact, through the further contact opening 46', the PZR sensor 39, moreover extending as far as a respective electrical-contact pad 38, which is also not illustrated herein.

As shown in FIG. 9, a supporting wafer (the so-called "handling wafer") 49 is coupled underneath the SOI wafer 40 and has, underneath the cavity 23 and in the mobile structure 22, a recess 49', to enable rotation of the mobile structure 22.

Figure 1B:
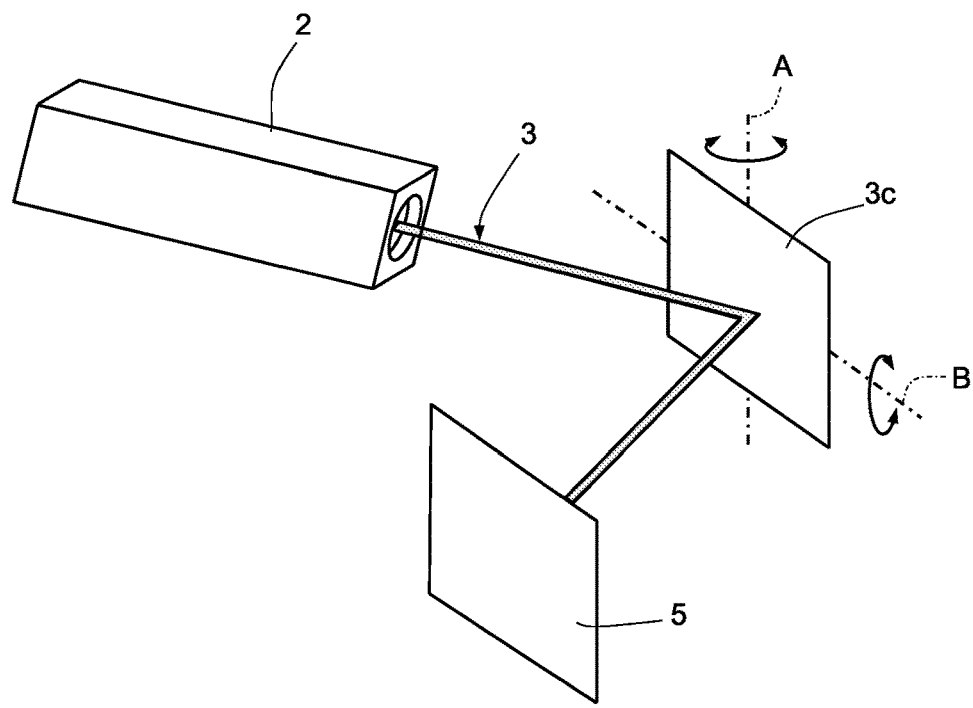
Figure 2A:
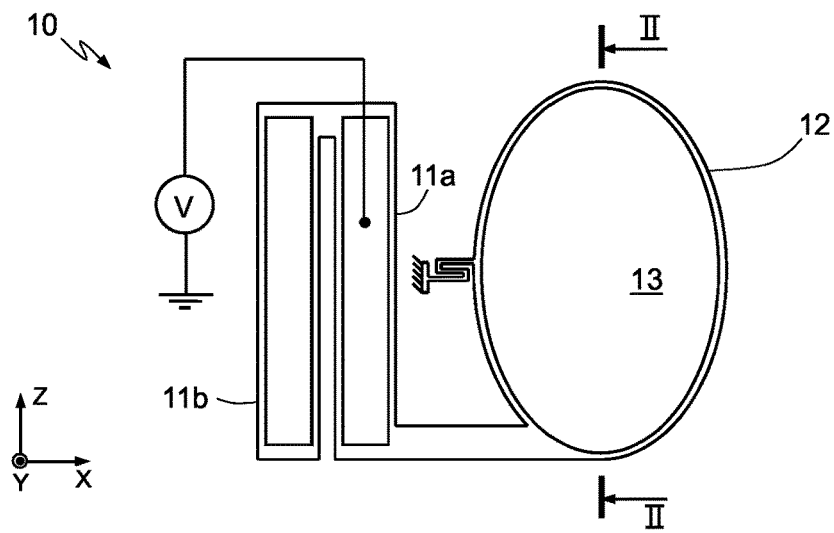
FIGS. 2A-2B show a portion of a mirror device with piezoelectric actuation of a known type, respectively in a schematic top plan view and in a schematic side section view.
Figure 2B:
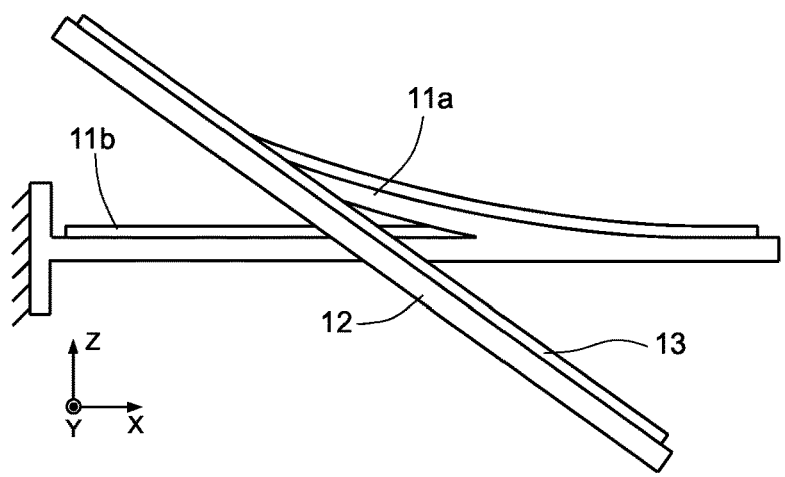
Figure 10A:
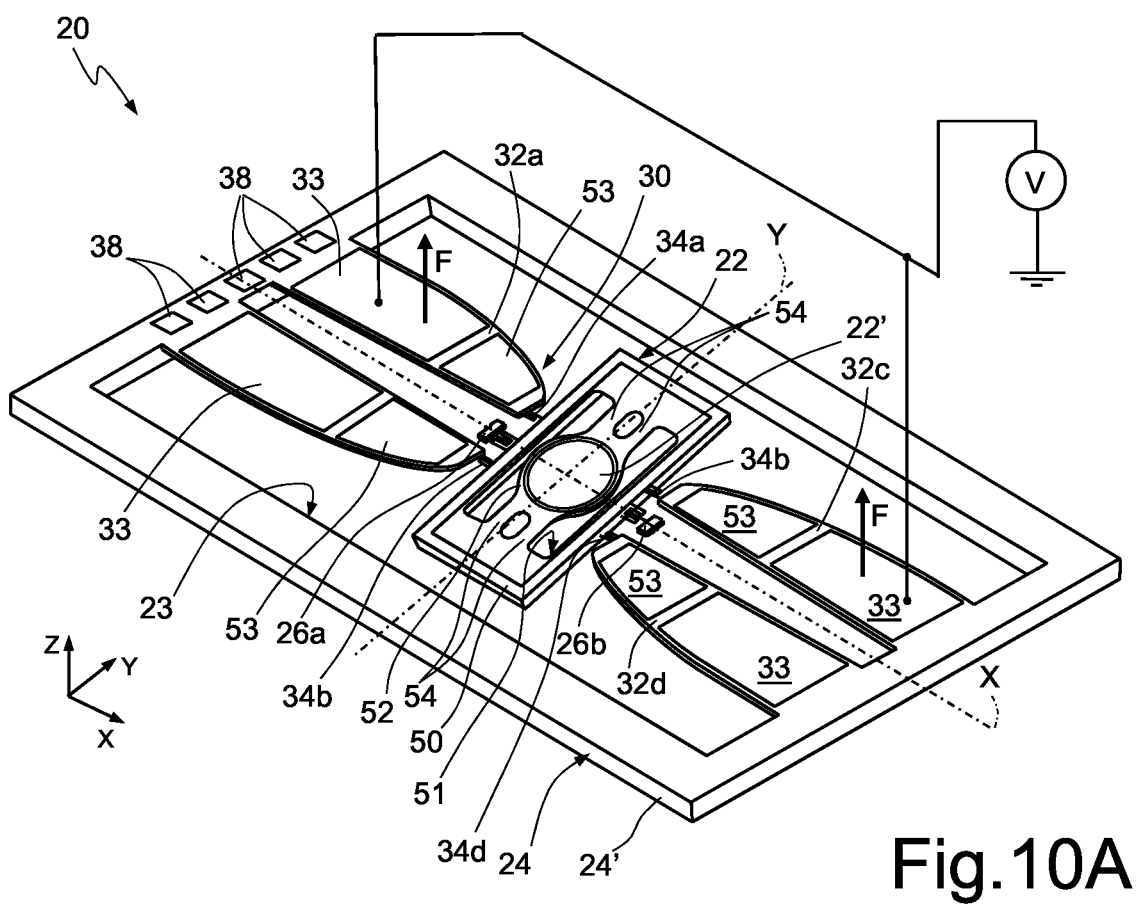
FIGS. 10A and 10B show a biaxial embodiment of the microelectromechanical device, highlighting the rotation movements thereof about a first rotation axis and a second rotation axis, respectively.
Figure 10B:
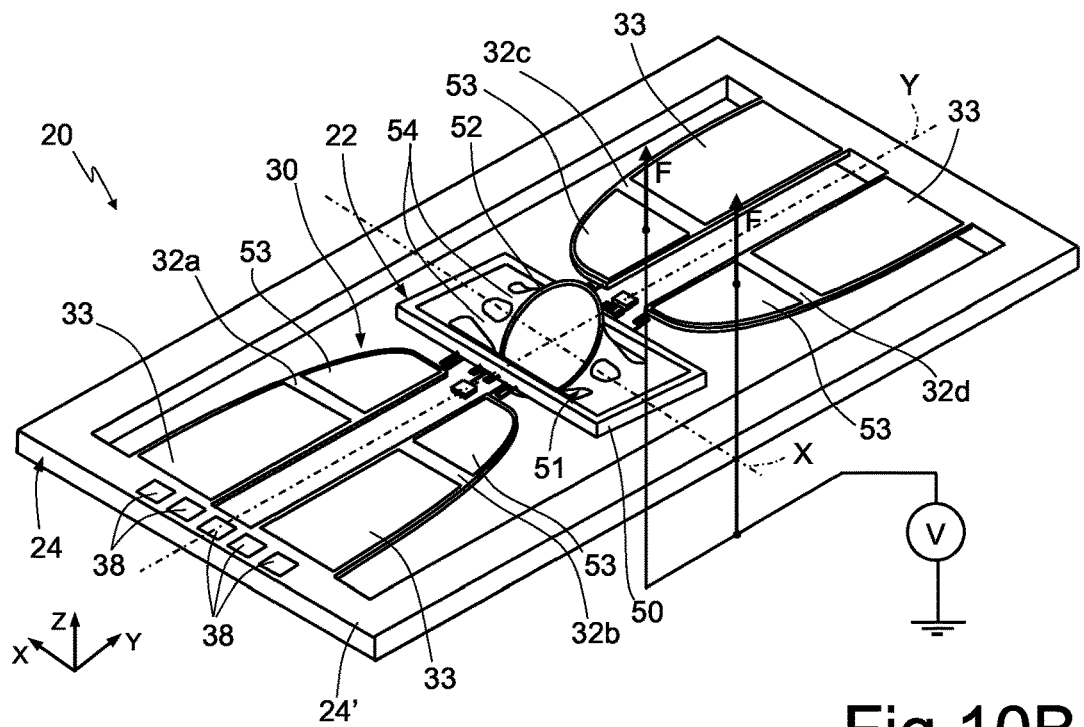

With reference to FIGS. 10A-10B a biaxial embodiment of the microelectromechanical device 20 is now described, where the tiltable structure 22 is able to perform rotation movements both about the first rotation axis (coinciding with the first median axis of symmetry X parallel to the first horizontal axis X) and about a second rotation axis (coinciding with the second median axis of symmetry Y parallel to the second horizontal axis Y; the second rotation axis corresponds, for example, to the vertical rotation axis A of a pico-projector apparatus; see, for example, FIG. 1B).

In this case, the tiltable structure 22 comprises an inner frame 50, having, for example, a substantially rectangular shape in the horizontal plane XY and internally defining a window 51.

The inner frame 50 is elastically coupled to the driving arms 32a-32d of the actuation structure 30 in a way altogether equivalent to what has been discussed previously with reference to FIG. 3. The inner frame 50 is hence driven in rotation about the first rotation axis by application of an appropriate biasing to the first regions of piezoelectric material 33, as described previously in detail, which causes generation of a force F (as indicated in FIG. 10A).

The tiltable structure 22 further comprises in this case a distinct supporting element 52, which is housed in the window 51 and is elastically coupled to the inner frame 50 by means of elastic elements 54, compliant to torsion about the second rotation axis, and moreover carries at the top the reflecting surface 22'. For instance, the supporting element 52 has a circular or elliptical shape in the horizontal plane XY.

During rotation about the first rotation axis, as shown in FIG. 10A, the supporting element 52 is fixedly coupled to the inner frame 50 so as to be driven in the same rotation, thus causing the desired movement of the reflecting surface 22'.

The actuation structure 30 in this case comprises second regions of piezoelectric material 53, designed to be appropriately biased for causing rotation of the supporting element 52 about the second rotation axis. The inner frame 50, as illustrated in FIG. 10B, decouples the rotations about the first and the second rotation axes.

In the embodiment illustrated, the second regions of piezoelectric material 53 are also carried by the driving arms 32a-32d, at the respective ends coupled to the tiltable structure 22, hence on the inside with respect to the first regions of piezoelectric material 33.

In particular, as is highlighted in the aforesaid FIG. 10B, the second regions of piezoelectric material 53 carried by the driving arms 32a-32b, 32c-32d of the first or second pairs are in this case biased at a same biasing voltage V' (at an appropriate resonance frequency) so as to generate a force F on the driving arms, which is transmitted through the inner frame 50 to generate resonant rotation of the supporting element 52 about the second rotation axis.

In a way not described in detail, further electrical-contact pads 38 are in this case present, which are, for example, once again arranged on the frame 24' of the fixed structure 24, for biasing the aforesaid second regions of piezoelectric material 53.

Figure 11:
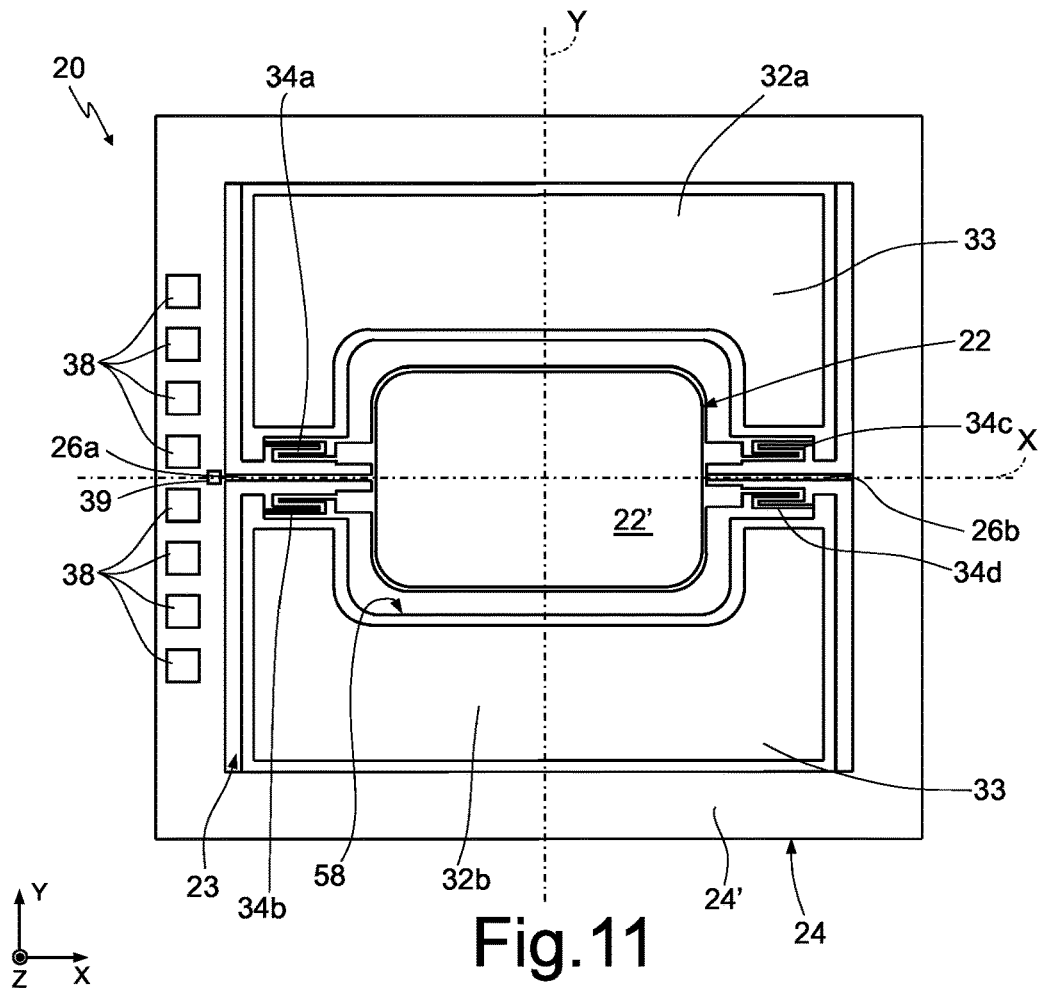
FIG. 11 is a schematic top plan view of a microelectromechanical device according to a further embodiment of the present solution.

With reference to FIG. 11, a further embodiment of the present solution is now described.

In this case, the actuation structure 30 of the microelectromechanical device 20 comprises just one pair of driving arms, designated once again by 32a, 32b.

These driving arms 32a, 32b are in this case generically C-shaped, with the major side of the "C" shape that extends longitudinally parallel to the first horizontal axis X and crosses the second median axis of symmetry Y, and the minor sides of the "C" shape that extend parallel to the second horizontal axis Y, on opposite sides of the tiltable structure 22 with respect to the second median axis of symmetry Y.

The aforesaid driving arms 32a, 32b are arranged on opposite sides of the tiltable structure 22 with respect to the first median axis of symmetry X and jointly define an inner window 58, arranged inside which is the tiltable structure 22, which has for example in this case a generically rectangular shape in the horizontal plane XY, with a main extension parallel to the first horizontal axis X.

Again, each driving arm 32a, 32b is suspended over the cavity 23 and carries, on a top surface thereof (opposite to the cavity 23) a respective first region of piezoelectric material 33 (e.g., PZT—lead zirconate titanate), having substantially the same extension in the horizontal plane XY as said driving arm 32a, 32b.

In this case, each driving arm 32a, 32b is moreover fixedly coupled to the frame 24' of the fixed structure 24 along all of the long side of the "C" shape and is elastically connected to the tiltable structure 22 by means of a respective pair of elastic decoupling elements, at the minor sides of the "C" shape: in particular, the first driving arm 32a is connected to the tiltable structure 22 by means of the first decoupling elastic element 34a and the third decoupling elastic element 34c, whereas the second driving arm 32b is connected to the same tiltable structure 22 by means of the second decoupling elastic element 34b and the fourth decoupling elastic element 34c.

In a way altogether similar to what has been discussed previously, also in this embodiment the aforesaid decoupling elastic elements 34a-34d are coupled to the tiltable structure 22 at respective coupling points Pa-Pd (here not illustrated), which are located in proximity of the first rotation axis (coinciding with the first median axis of symmetry X), at the short distance d from the first rotation axis.

For instance, also in this embodiment, the decoupling elastic elements 34a-34d are of a folded type (but could alternatively be of a linear type).

In the example illustrated in the aforesaid FIG. 11, the first and the second elastic suspension elements 26a, 26b, which also in this case elastically connect the tiltable structure 22 to the fixed structure 24, have a linear shape, instead of a folded shape, having in any case once again a high stiffness in regard to the movement out of the horizontal plane XY and being, instead, compliant in regard to torsion about the first horizontal axis X.

Figure 12A:
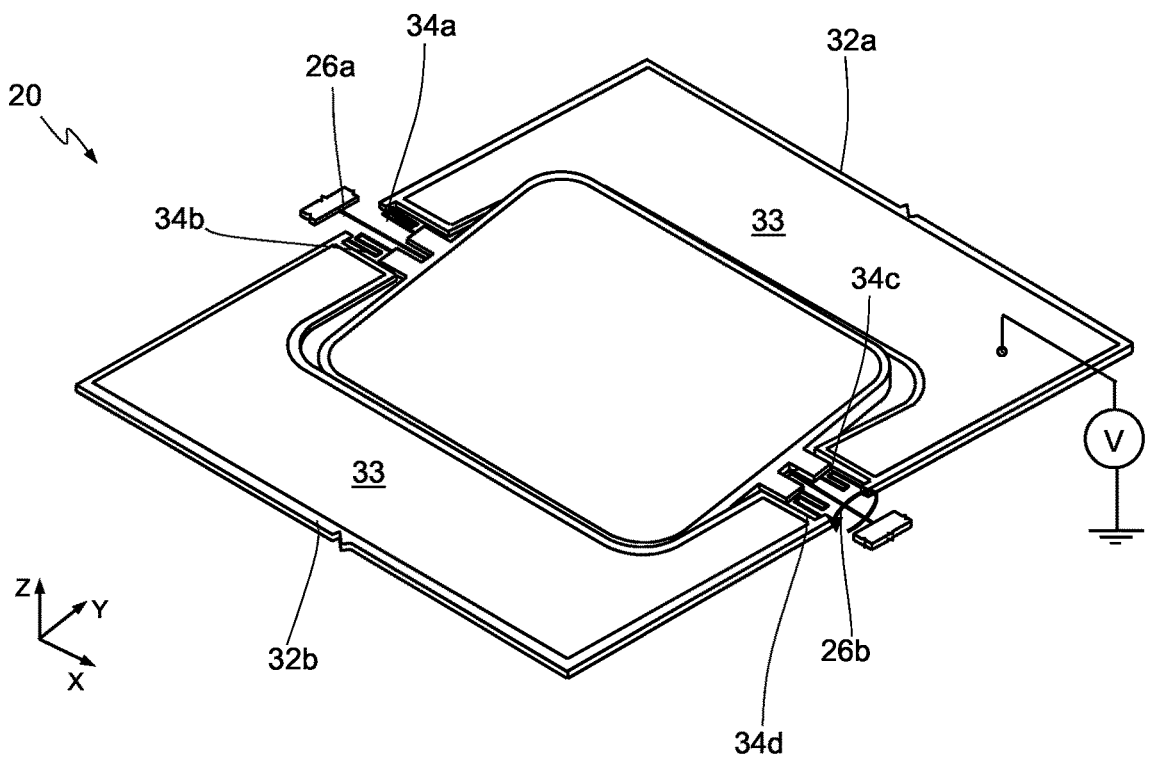
FIGS. 12A-12B are schematic illustrations of the microelectromechanical device of FIG. 11 with a first rotation movement and a second rotation movement of a corresponding tiltable structure about a rotation axis.
Figure 12B:
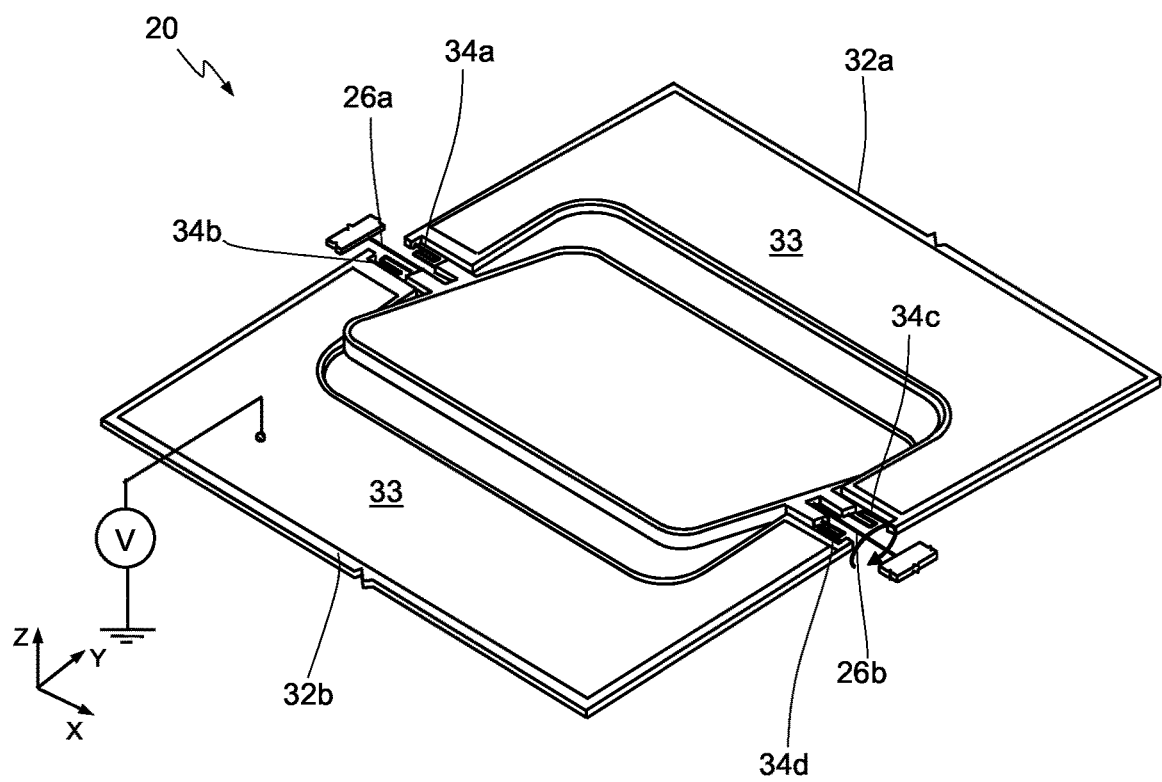

Altogether similar considerations apply as regards operation of the microelectromechanical device 20. In particular, application of the biasing voltage V to the first region of piezoelectric material 33 carried by the first or second driving arms 32a, 32b causes rotation, in a positive direction (as illustrated in FIG. 12A) or a negative direction (as illustrated in FIG. 12B) of the tiltable structure 22 about the first rotation axis.

The embodiment described determines a different form factor of the microelectromechanical device 20, which enables a smaller resulting size to be obtained in the case where the tiltable structure 22 has a main extension along the first rotation axis (as is common in the case of mirror devices that perform a raster scan).

Moreover, the above embodiment may enable a more convenient routing of the electrical signals towards the electrical-contact pads 38, given the low number (two) of piezoelectric actuators.

Figure 13:
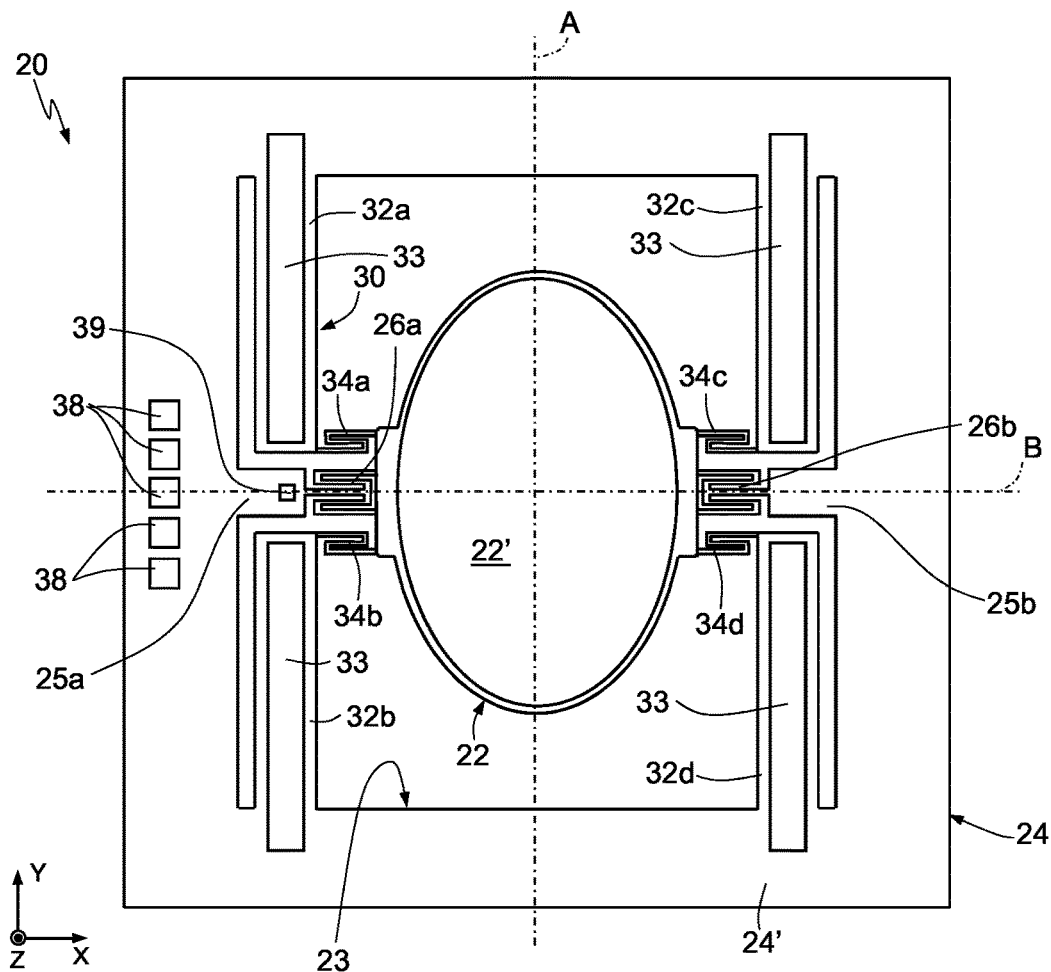
FIG. 13 is a schematic top plan view of a microelectromechanical device according to yet a further embodiment of the present solution.

With reference to FIG. 13, yet a further embodiment of the present solution is now described, where the actuation structure 30 of the microelectromechanical device 20 once again comprises a first and a second pair of driving arms, designated also in this case by 32a-32b and 32c-32d.

Unlike what has been illustrated previously, the aforesaid driving arms 32a-32d have a main extension parallel to the second horizontal axis Y, hence in a direction transverse to the first rotation axis of the tiltable structure 22, and a much smaller extension in a direction parallel to the first horizontal axis X. In the example, the driving arms 32a-32d have a substantially rectangular shape in the horizontal plane XY.

Also in this case, each driving arm 32a-32d carries, on a top surface thereof (opposite to the cavity 23) a respective first region of piezoelectric material 33, and moreover has a respective first end fixedly coupled to the frame 24' of the fixed structure 24 and a respective second end elastically coupled to the tiltable structure 22, by means of a respective decoupling elastic element 34a-34d.

In this embodiment, in which once again the frame 24' has a substantially rectangular shape in the horizontal plane XY, the first end of the driving arms 32a-32d is fixedly coupled to the sides of said frame 24', which have an extension parallel to the first horizontal axis X (parallel to the first rotation axis of the tiltable structure 22).

In the example illustrated in the aforesaid FIG. 13, the first and the second elastic suspension elements 26a, 26b, which also in this case elastically couple the tiltable structure 22 to the fixed structure 24, have a folded configuration, having, however, also in this case a high stiffness in regard to the movement out of the horizontal plane XY and being instead compliant in regard to torsion about the first horizontal axis X.

Figure 14:
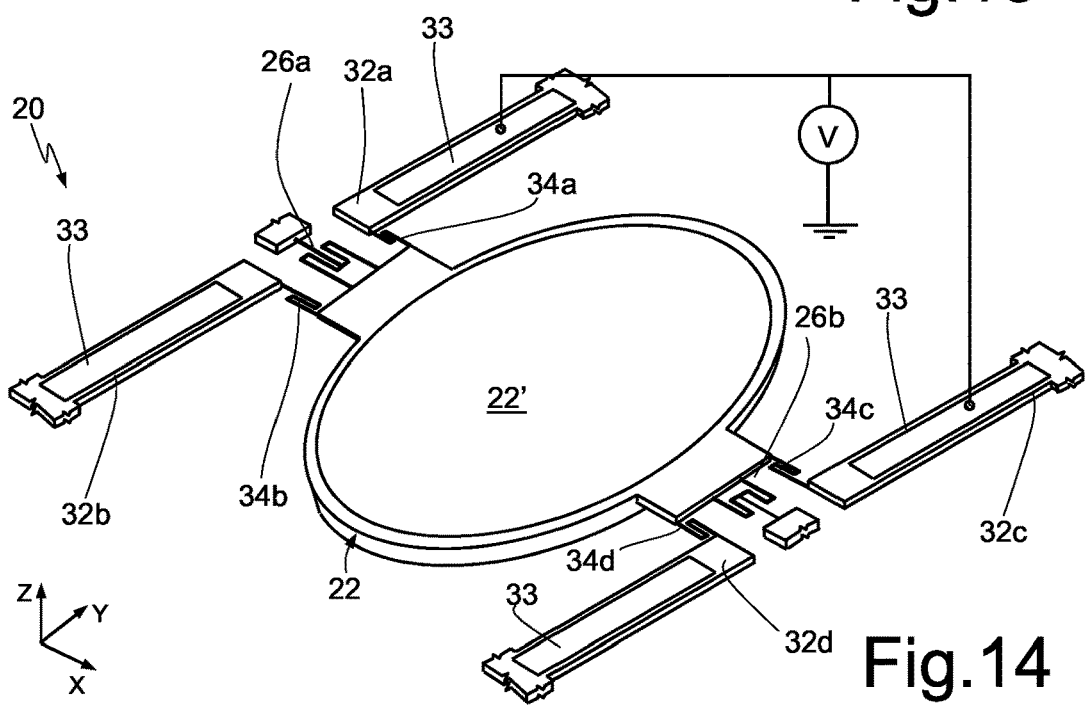
FIG. 14 is a schematic illustration of the microelectromechanical device of FIG. 13, with a rotation movement of a corresponding tiltable structure about a rotation axis.

Altogether similar considerations apply as regards operation of the microelectromechanical device 20. In particular, application of the biasing voltage V to the first regions of piezoelectric material 33 carried by the first and third driving arms 32a, 32c causes rotation in a positive direction (as illustrated in FIG. 14, by way of example), whereas application of the biasing voltage V to the first regions of piezoelectric material 33 carried by the second and the fourth driving arms 32b, 32d causes a corresponding rotation in the negative direction of the tiltable structure 22 about the first rotation axis (in a way here not illustrated).

The above embodiment may advantageously be used to achieve driving of the tiltable structure 22 at low frequency and in resonance condition (instead of a linear or quasi-static driving). Moreover, this embodiment enables a reduction of the dimensions of the electromechanical device 20.

The advantages of the present solution emerge clearly from the foregoing description.

In any case, it is underlined that the solution described, in its various embodiments, enables exploitation of the advantages of piezoelectric actuation (i.e., the use of low biasing voltages with a low energy consumption to obtain large displacements), at the same time presenting improved mechanical and electrical performance as compared to known solutions.

In fact, the microelectromechanical device 20 does not have spurious modes (of any type) at frequencies close to the actuation frequency. Moreover, the microelectromechanical device 20 is less sensitive to strains and stresses along the orthogonal axis Z as compared to known solutions that adopt the same piezoelectric-actuation principle.

Moreover, as indicated above, the particular configuration of the piezoresistive sensor 39, discussed with reference to FIGS. 6, 7A-7B and 8A-8B allows, considering the same other characteristics of the microelectromechanical structure, to maximize the detection sensitivity and, therefore, the controllability of the microelectronic device 20 (for example by an external electronic apparatus).

Figure 15:
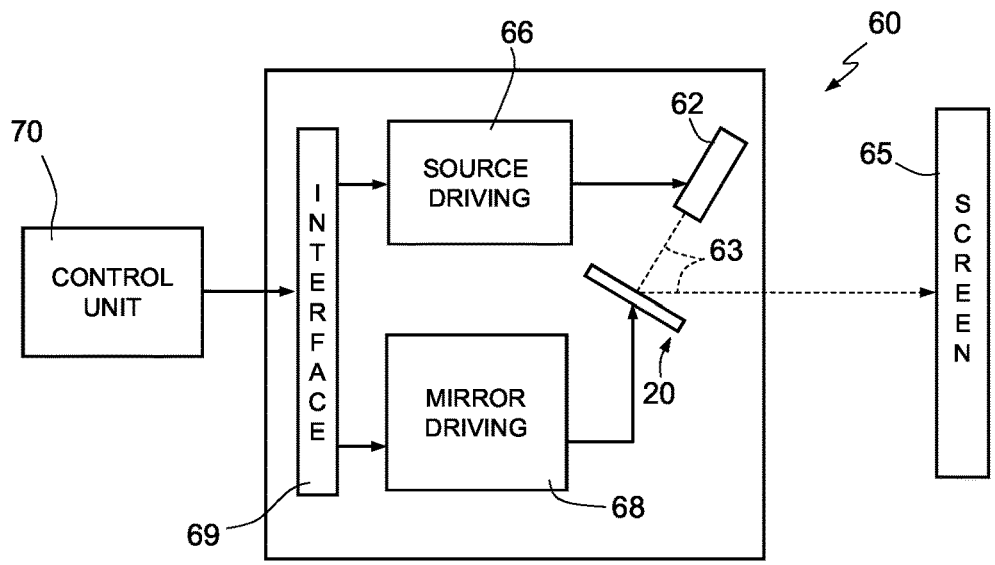
FIG. 15 is a block diagram of a pico-projector that uses the present microelectronic device.
Figure 16:
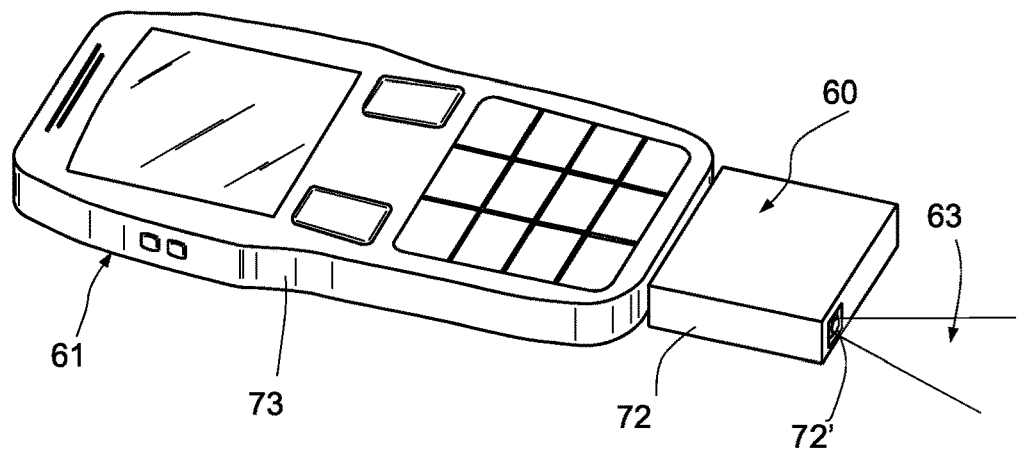
FIGS. 16 and 17 show variants of coupling between the pico-projector of FIG. 15 and a portable electronic apparatus.
Figure 17:
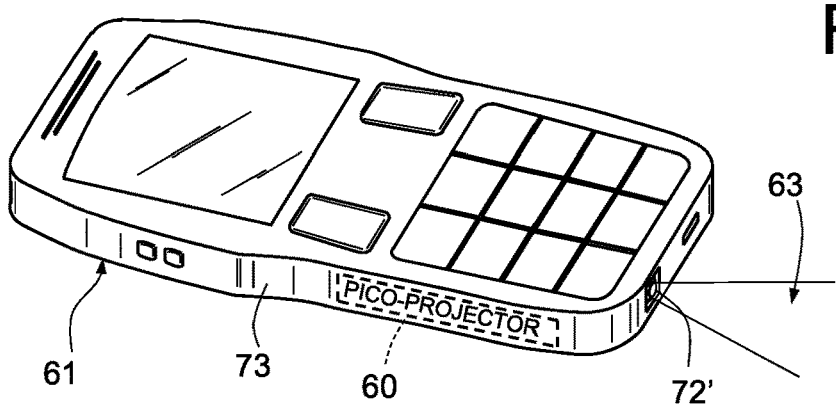

Advantageously, the microelectromechanical device 20 can be used in a pico-projector 60 designed to be functionally coupled to a portable electronic apparatus 61, as illustrated schematically with reference to FIGS. 15-17.

In detail, the pico-projector 60 of FIG. 15 comprises: a light source 62, for example of a laser type, adapted to generate a light beam 63; the microelectronic device 20, acting as a mirror and designed to receive the light beam 63 and direct it towards a screen or display surface 65 (external to, and set at a distance, from the pico-projector 60); a first driving circuit 66, designed to provide appropriate control signals to the light source 62, for generation of the light beam 63 as a function of an image to be projected; a second driving circuit 68, designed to provide driving signals to the actuation structure 30 of the microelectronic device 20; and a communication interface 69, designed to receive, from an external control unit 70, for example included in the portable apparatus 61, information on the image to be generated, for example in the form of a pixel array. This information is sent as an input for driving of the light source 62.

The pico-projector 60 can be provided as a separate and stand-alone accessory with respect to an associated portable apparatus 61, for example a smartphone, as illustrated in FIG. 16. In this case, the pico-projector 60 is coupled to the portable electronic apparatus 61 by means of appropriate electrical and mechanical connection elements (not illustrated in detail). Here, the pico-projector 60 is provided with a casing 72 of its own, which has at least one portion 72' transparent to the light beam 63 coming from the microelectronic device 20. The casing 72 of the pico-projector 60 is coupled in a releasable manner to a respective case 73 of the portable electronic apparatus 61.

Alternatively, as illustrated in FIG. 17, the pico-projector 60 can be integrated within the portable electronic apparatus 61 and be set within the case 73 of the same portable electronic apparatus 61. In this case, the portable electronic apparatus 61 has a respective portion 72' transparent to the light beam 63 coming from the microelectronic device 20. The pico-projector 60 is, in this case, for example, coupled to a printed circuit board within the case 73 of the portable electronic apparatus 61.

Finally, it is clear that modifications and variations may be made to what has been described and illustrated herein, without thereby departing from the scope of this disclosure.

In particular, it is evident that further embodiments, of a biaxial type, of the microelectromechanical device 20 could be envisaged, based on the embodiments of FIGS. 11 and 10, in a way substantially similar to what has been described in detail with reference to FIGS. 10A-10B.

Moreover, it is evident that variants may in general be envisaged as regards the shape of the elements forming the microelectromechanical device 20; for example, the tiltable structure 22 (and the corresponding reflecting surface 22') may have different shapes.

Moreover, it is highlighted that, as mentioned previously, the elastic suspension elements 26a-26b and the decoupling elastic elements 34a-34d could be linear, instead of a folded type, having in any case a high stiffness in regard to movements out of the horizontal plane XY and being compliant in regard to the rotation.

Furthermore, in a completely corresponding manner to what discussed above, the piezoresistive sensor 39 and the associated mechanical amplification structure 100 could be formed at the second supporting element 25*b*, in this case the first and the second lever mechanism 102, 112 being coupled between the same second supporting element 25*b* and the third, respectively the fourth, driving arms 32*c*, 32*d*.

Moreover, the same amplification mechanical structure 100 could be applied, with suitable modifications, also to the second and third embodiments of the present solution (discussed previously with reference to FIGS. 11 and 13).

The invention claimed is:

1. A microelectromechanical device, comprising:
  a fixed structure defining a cavity;
  a tiltable structure elastically suspended in the cavity and having a main extension in a horizontal plane; and
  a piezoelectrically driven actuation structure configured to cause rotation of the tiltable structure about at least a first rotation axis parallel to a first horizontal axis of the horizontal plane, with the piezoelectrically driven actuation structure being interposed between the tiltable structure and the fixed structure;
  the piezoelectrically driven actuation structure comprising at least a first pair of driving arms which carry respective regions of piezoelectric material;
  the tiltable structure elastically being coupled to the fixed structure at the first rotation axis by elastic suspension elements which have a high stiffness with respect to movements out of the horizontal plane but are compliant with respect to torsion about the first rotation axis, with the elastic suspension elements extending along the first rotation axis between a central portion of opposite sides of the tiltable structure and the fixed structure; and
  wherein the first pair of driving arms are elastically coupled to the tiltable structure on opposite sides of the first rotation axis by respective decoupling elastic elements having a high stiffness with respect to movements out of the horizontal plane but being compliant with respect to torsion about the first rotation axis.

2. The microelectromechanical device according to claim 1, wherein the decoupling elastic elements are coupled to the tiltable structure in proximity to the first rotation axis.

3. The microelectromechanical device according to claim 2,
  wherein the decoupling elastic elements extend between their respective driving arms and the tiltable structure, and are coupled at respective coupling points located on opposite sides of the first rotation axis; and
  wherein a distance between the coupling points of the decoupling elastic elements to the tiltable structure and the first rotation axis is smaller than a respective distance between the coupling points and an edge end of the tiltable structure along a second horizontal axis of the horizontal plane, orthogonal to the first horizontal axis, with the edge end being on a same side of the first rotation axis as the coupling points.

4. The microelectromechanical device according to claim 1, wherein the decoupling elastic elements are of a folded type.

5. The microelectromechanical device according to claim 1,
  wherein the fixed structure forms a frame in the horizontal plane delimiting and surrounding the cavity, and wherein the fixed structure also has first and second supporting elements which extend longitudinally along the first rotation axis within the cavity, starting from the frame, on opposite sides of the tiltable structure; and
  the elastic suspension elements extend between the tiltable structure and a respective one of the first and second supporting elements.

6. The microelectromechanical device according to claim 5, further comprising:
  a first lever mechanism coupled between the first supporting element and a first driving arm of the first pair;
  the first lever mechanism includes a lever arm with a longitudinal extension along the first horizontal axis, a first end coupled to the first driving arm, and a second end coupled to a coupling element, integral with the first supporting element, by a torsional elastic element; and
  a first pair of piezoresistors formed at the coupling element and defining a piezoresistive sensor configured to detect displacement of the tiltable structure.

7. The microelectromechanical device according to claim 6, further comprising:
  a second lever mechanism coupled between the first supporting element and a second driving arm of the first pair and arranged symmetrically to the first lever mechanism with respect to the first horizontal axis;
  the second lever mechanism includes a respective lever arm with a longitudinal extension along the first horizontal axis, a respective first end coupled to the second driving arm, and a respective second end coupled to a respective coupling element, integral with the first supporting element on an opposite side concerning the coupling element of the first lever mechanism, by a respective torsional elastic element; and
  a second pair of piezoresistors formed at the respective coupling element defining, together with the first pair of piezoresistors, the piezoresistive sensor.

8. The microelectromechanical device according to claim 7, further comprising:
  conductive paths provided at the first supporting element and configured to connect the piezoresistors of the first and second pairs together according to a Wheatstone bridge connection scheme, and to connect the piezoresistors to associated electrical-contact pads; and
  wherein the piezoresistors of the first pair constitute a first half-bridge of the Wheatstone bridge, and wherein the piezoresistors of the second pair constitute a second half-bridge of the Wheatstone bridge.

9. The microelectromechanical device according to claim 1, wherein the driving arms have a first end elastically coupled to the tiltable structure by the respective decoupling elastic elements and a second end, longitudinally opposite with respect to the first end, fixedly coupled to the fixed structure.

10. The microelectromechanical device according to claim 9, wherein the driving arms have a main extension along the first rotation axis.

11. The microelectromechanical device according to claim 9, wherein the driving arms have a main extension parallel to a second horizontal axis of the horizontal plane, orthogonal to the first horizontal axis.

12. The microelectromechanical device according to claim 9, further comprising:
  a second pair of driving arms arranged symmetrically to the first pair of driving arms with respect to a second horizontal axis of the horizontal plane, orthogonal to the first horizontal axis, and positioned on opposite sides of the first rotation axis; and wherein the driving arms of the second pair carry respective regions of piezoelectric material and are elastically coupled to the tiltable structure on opposite sides and in proximity to the first rotation axis by respective decoupling elastic elements which have high stiffness regarding movements out of the horizontal plane and are compliant concerning torsion about the first rotation axis.

13. The microelectromechanical device according to claim 1, wherein:
the driving arms have a C-shaped conformation with a major side that extends longitudinally parallel to the first rotation axis, on an opposite side of the tiltable structure with respect to the first rotation axis, and minor sides that extend parallel to a second horizontal axis of the horizontal plane, on opposite sides of the tiltable structure with respect to the second horizontal axis; and
each driving arm is fixedly coupled to the fixed structure at the major side and is elastically connected to the tiltable structure by a respective pair of decoupling elastic elements at the minor sides.

14. The microelectromechanical device according to claim 1, further comprising electrical-contact pads carried by the fixed structure and electrically connected to the regions of piezoelectric material of the driving arms, said electrical-contact pads configured to enable electrical biasing of the regions of piezoelectric material through electrical biasing signals.

15. The microelectromechanical device according to claim 1, wherein:
the tiltable structure is configured to perform rotation movements about both the first rotation axis and a second rotation axis, parallel to a second horizontal axis of the horizontal plane, orthogonal to the first horizontal axis;
the tiltable structure includes an inner frame defining a window and elastically coupled to the driving arms by the decoupling elastic elements allowing rotation about the first rotation axis, and a supporting element housed in the window and elastically coupled to the inner frame by elastic elements, which are compliant in regard to torsion about the second rotation axis, so as to be driven in rotation about the second rotation axis; and
the piezoelectrically driven actuation structure comprises additional regions of piezoelectric material carried by the driving arms and configured to cause rotation of the supporting element about the second rotation axis, independently and decoupled from the inner frame.

16. The microelectromechanical device according to claim 1, wherein the tiltable structure carries a reflecting surface to provide a mirror structure.

17. A microelectromechanical device, comprising:
a fixed structure defining a cavity;
a tiltable structure elastically suspended in the cavity with a main extension in a horizontal plane;
a piezoelectrically driven actuation structure interposed between the tiltable structure and the fixed structure and configured to rotate the tiltable structure about a first rotation axis parallel to a first horizontal axis;
wherein the piezoelectrically driven actuation structure includes a first pair of driving arms with piezoelectric material, elastically coupled to the tiltable structure on opposite sides of the first rotation axis by decoupling elastic elements that are stiff with respect to out-of-plane movements and compliant with respect to torsional movements about the first rotation axis;
the tiltable structure being elastically coupled to the fixed structure at the first rotation axis by elastic suspension elements which are stiff with respect to out-of-plane movements and compliant with respect to torsional movements about the first rotation axis;
the fixed structure forming a frame surrounding the cavity, with first and second supporting elements extending longitudinally along the first rotation axis within the cavity;
elastic suspension elements extending between the tiltable structure and the first and second supporting elements; and
a first lever mechanism coupled between the first supporting element and a first driving arm, the first lever mechanism comprising a lever arm, a torsional elastic element, and a coupling element with a first pair of piezoresistors forming a piezoresistive sensor.

18. The microelectromechanical device according to claim 17, wherein the lever arm of the first lever mechanism has a longitudinal extension along the first horizontal axis, a first end coupled to the first driving arm, and a second end coupled through a torsional elastic element to a coupling element that is integral with the first supporting element.

19. The microelectromechanical device according to claim 17,
further comprising a second lever mechanism symmetrically arranged with respect to the first lever mechanism, coupled between the first supporting element and a second driving arm;
the second lever mechanism including a lever arm, a torsional elastic element, and a coupling element with a second pair of piezoresistors; and
the first and second pairs of piezoresistors defining the piezoresistive sensor.

20. The microelectromechanical device according to claim 19, wherein the lever arm of the second lever mechanism has a longitudinal extension along the first horizontal axis, a first end coupled to the second driving arm, and a second end coupled through a respective torsional elastic element to a respective coupling element that is integral with the first supporting element.

21. The microelectromechanical device according to claim 19,
further comprising conductive paths on the first supporting element connecting the piezoresistors of the first and second pairs in a Wheatstone bridge and connecting those piezoresistors to electrical-contact pads;
wherein the first pair of piezoresistors forms a first half-bridge of the Wheatstone bridge, and wherein the second pair forms a second half-bridge of the Wheatstone bridge.

* * * * *